United States Patent
Yang et al.

(10) Patent No.: US 6,720,027 B2
(45) Date of Patent: Apr. 13, 2004

(54) CYCLICAL DEPOSITION OF A VARIABLE CONTENT TITANIUM SILICON NITRIDE LAYER

(75) Inventors: Michael X. Yang, Palo Alto, CA (US); Ming Xi, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 10/119,369

(22) Filed: Apr. 8, 2002

(65) Prior Publication Data

US 2003/0190497 A1 Oct. 9, 2003

(51) Int. Cl.$^7$ ................................................. B05D 5/12
(52) U.S. Cl. ................ 427/123; 427/250; 427/255.394; 427/255.7; 427/331; 427/402; 427/404
(58) Field of Search ................................. 427/123, 250, 427/255.394, 255.7, 331, 402, 404

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Matsumoto | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |

(List continued on next page.)

FOREIGN PATENT DOCUMENTS

| | | | | |
|---|---|---|---|---|
| DE | 196 27 017 A1 | 1/1997 | ......... | H01L/21/283 |
| DE | 198 20 147 A1 | 7/1999 | ....... | H01L/21/3205 |

(List continued on next page.)

OTHER PUBLICATIONS

Hultman, et al., "Review of the thermal and mechanical stability of TiN-based thin films", *Zertschrift Fur Metallkunde,* 90(10) (Oct. 1999), pp. 803–813.

(List continued on next page.)

*Primary Examiner*—Bernard Pianalto
(74) *Attorney, Agent, or Firm*—Moser, Patterson & Sheridan, LLP

(57) ABSTRACT

Embodiments of the invention relate to an apparatus and method of depositing a titanium silicon nitride layer by cyclical deposition. In one aspect, a titanium silicon nitride layer having a variable content or a controlled composition of titanium, silicon, and nitrogen through the depth of the layer may be formed. One embodiment of this variable content titanium silicon nitride layer or tuned titanium silicon nitride layer includes a bottom sub-layer of $TiSi_{X1}N_{Y1}$, a middle sub-layer of $TiSi_{X2}N_{Y2}$, and a top sub-layer of $TiSi_{X3}N_{Y3}$ in which X1 is less than X2 and X3 is less than X2. Another embodiment of a variable content titanium silicon nitride layer includes a bottom sub-layer of $TiSi_{X1}N_{Y1}$ and a top sub-layer of $TiSi_{X2}N_{Y2}$ in which X2 is greater than X1. Still another embodiment of a variable content titanium silicon nitride layer includes a bottom sub-layer of $TiSi_{X1}N_{Y1}$, a middle sub-layer of $TiSi_{X2}N_{Y2}$, and a top sub-layer of $TiSi_{X3}N_{Y3}$ in which X1 is greater than X2 and X3 is greater than X2.

35 Claims, 12 Drawing Sheets

U.S. PATENT DOCUMENTS

| | | | |
|---|---|---|---|
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | 118/715 |
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,609 A | 3/1994 | Horiike et al. | 427/576 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/613 |
| 5,306,666 A | 4/1994 | Izumi | 437/192 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 ME |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | 428/641 |
| 5,503,875 A | 4/1996 | Imai et al. | 427/255.3 |
| 5,521,126 A | 5/1996 | Okamura et al. | 437/235 |
| 5,526,244 A | 6/1996 | Bishop | 362/147 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,580,380 A | 12/1996 | Liu et al. | 117/86 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/711 |
| 5,730,801 A | 3/1998 | Tepman et al. | 118/719 |
| 5,730,802 A | 3/1998 | Ishizumi et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,013,553 A | 1/2000 | Wallace et al. | 438/287 |
| 6,015,590 A | 1/2000 | Suntola et al. | 427/255.23 |
| 6,015,917 A | 1/2000 | Bhandari et al. | 556/12 |
| 6,020,243 A | 2/2000 | Wallace et al. | 438/287 |
| 6,025,627 A | 2/2000 | Forbes et al. | 257/321 |
| 6,036,773 A | 3/2000 | Wang et al. | 117/97 |
| 6,042,652 A | 3/2000 | Hyun et al. | 118/719 |
| 6,043,177 A | 3/2000 | Falconer et al. | 502/4 |
| 6,051,286 A | 4/2000 | Zhao et al. | 427/576 |
| 6,062,798 A | 5/2000 | Muka | 414/416 |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,237 A | 10/2000 | Chan et al. | 438/687 |
| 6,140,238 A | 10/2000 | Kitch | 438/687 |
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,207,487 B1 | 3/2001 | Kim et al. | 438/238 |
| 6,238,734 B1 | 5/2001 | Senzaki et al. | 427/226 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |

| | | | |
|---|---|---|---|
| 6,284,646 B1 | 9/2001 | Leem | 438/629 |
| 6,287,965 B1 | 9/2001 | Kang et al. | 438/648 |
| 6,291,283 B1 | 9/2001 | Wilk | 438/216 |
| 6,291,876 B1 | 9/2001 | Stumborg et al. | 257/632 |
| 6,297,539 B1 | 10/2001 | Ma et al. | 257/410 |
| 6,299,294 B1 | 10/2001 | Regan | 347/62 |
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 6,333,260 B1 | 12/2001 | Kwon et al. | 438/643 |
| 6,342,277 B1 | 1/2002 | Sherman | 427/562 |
| 6,348,376 B2 | 2/2002 | Lim et al. | 438/253 |
| 6,348,386 B1 | 2/2002 | Gilmer | 438/288 |
| 6,355,561 B1 | 3/2002 | Sandhu et al. | 438/676 |
| 6,358,829 B2 | 3/2002 | Yoon et al. | 438/597 |
| 6,368,954 B1 | 4/2002 | Lopatin et al. | 438/627 |
| 6,369,430 B1 | 4/2002 | Adetutu et al. | 257/382 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 437/704 |
| 6,391,803 B1 | 5/2002 | Kim et al. | 438/787 |
| 6,395,650 B1 | 5/2002 | Callegari et al. | 438/785 |
| 6,399,491 B2 | 6/2002 | Jeon et al. | 438/680 |
| 6,416,577 B1 | 7/2002 | Suntola et al. | 117/88 |
| 6,416,822 B1 | 7/2002 | Chiang et al. | 427/561 |
| 6,420,189 B1 | 7/2002 | Lopatin | 438/2 |
| 6,420,279 B1 | 7/2002 | Ono et al. | 438/785 |
| 6,423,619 B1 | 7/2002 | Grant et al. | 438/589 |
| 6,428,859 B1 | 8/2002 | Chiang et al. | 427/457 |
| 6,447,933 B1 | 9/2002 | Wang et al. | 428/635 |
| 6,451,119 B2 | 9/2002 | Sneh et al. | 118/715 |
| 6,451,695 B2 | 9/2002 | Sneh | 438/685 |
| 6,452,229 B1 | 9/2002 | Krivokapic | 257/330 |
| 6,458,701 B1 | 10/2002 | Chae et al. | 438/680 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,482,262 B1 | 11/2002 | Elers et al. | 117/84 |
| 6,482,733 B2 | 11/2002 | Raaijmakers | 438/633 |
| 6,482,740 B2 | 11/2002 | Soininen et al. | 438/686 |
| 6,492,283 B2 | 12/2002 | Raaijmakers et al. | 438/770 |
| 6,511,539 B1 | 1/2003 | Raaijmakers | 117/102 |
| 6,534,395 B2 | 3/2003 | Werkhoven et al. | 438/627 |
| 6,548,424 B2 | 4/2003 | Putkonen | 438/785 |
| 2001/0000866 A1 | 5/2001 | Sneh et al. | 118/723 R |
| 2001/0002280 A1 | 5/2001 | Sneh | 427/255.28 |
| 2001/0009140 A1 | 7/2001 | Bondestam et al. | 118/725 |
| 2001/0009695 A1 | 7/2001 | Saanila et al. | 427/255.39 |
| 2001/0011526 A1 | 8/2001 | Doering et al. | 118/729 |
| 2001/0021589 A1 | 9/2001 | Wilk | 438/778 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0029094 A1 | 10/2001 | Mee-Young et al. | 438/597 |
| 2001/0029891 A1 | 10/2001 | Oh et al. | 118/722 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |
| 2001/0042799 A1 | 11/2001 | Kim et al. | 239/553 |
| 2001/0050039 A1 | 12/2001 | Park | 117/102 |
| 2001/0054730 A1 | 12/2001 | Kim et al. | 257/301 |
| 2001/0054769 A1 | 12/2001 | Raaijmakers et al. | 257/758 |
| 2002/0000598 A1 | 1/2002 | Kang et al. | 257/301 |
| 2002/0004293 A1 | 1/2002 | Soininen et al. | 438/584 |
| 2002/0005556 A1 | 1/2002 | Cartier et al. | 257/381 |
| 2002/0007790 A1 | 1/2002 | Park | 118/715 |
| 2002/0008297 A1 | 1/2002 | Park et al. | 257/510 |
| 2002/0014647 A1 | 2/2002 | Seidl et al. | 257/301 |
| 2002/0015790 A1 | 2/2002 | Baum et al. | 427/255.28 |
| 2002/0016084 A1 | 2/2002 | Todd | 438/791 |
| 2002/0019121 A1 | 2/2002 | Pyo | 438/618 |
| 2002/0020869 A1 | 2/2002 | Park et al. | 257/306 |
| 2002/0021544 A1 | 2/2002 | Cho et al. | 361/200 |
| 2002/0029092 A1 | 3/2002 | Gass | 700/116 |
| 2002/0037630 A1 | 3/2002 | Agarwal et al. | 438/430 |
| 2002/0041931 A1 | 4/2002 | Suntola et al. | 427/255.28 |
| 2002/0043666 A1 | 4/2002 | Parsons et al. | 257/200 |
| 2002/0047151 A1 | 4/2002 | Kim et al. | 257/301 |
| 2002/0048635 A1 | 4/2002 | Kim et al. | 427/331 |
| 2002/0048880 A1 | 4/2002 | Lee | 438/253 |
| 2002/0052097 A1 | 5/2002 | Park | 438/507 |
| 2002/0055235 A1 | 5/2002 | Agarwal et al. | 438/430 |
| 2002/0061612 A1 | 5/2002 | Sandhu et al. | 438/151 |
| 2002/0064970 A1 | 5/2002 | Chooi et al. | 438/785 |
| 2002/0068458 A1 | 6/2002 | Chiang et al. | 438/694 |
| 2002/0073924 A1 | 6/2002 | Chiang et al. | 118/723 R |
| 2002/0074588 A1 | 6/2002 | Lee | 257/306 |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0081826 A1 | 6/2002 | Rotondaro et al. | 438/585 |
| 2002/0081844 A1 | 6/2002 | Jeon et al. | 438/680 |
| 2002/0090829 A1 | 7/2002 | Sandhu et al. | 438/761 |
| 2002/0093046 A1 | 7/2002 | Moriya et al. | 257/315 |
| 2002/0093781 A1 | 7/2002 | Bachhofer et al. | 361/312 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 |
| 2002/0105088 A1 | 8/2002 | Yang et al. | 257/774 |
| 2002/0106536 A1 | 8/2002 | Lee et al. | 428/702 |
| 2002/0106846 A1 | 8/2002 | Seutter et al. | 438/200 |
| 2002/0109168 A1 | 8/2002 | Kim et al. | 257/295 |
| 2002/0117399 A1 | 8/2002 | Chen et al. | 205/125 |
| 2002/0121697 A1 | 9/2002 | Marsh | 257/751 |
| 2002/0135071 A1 | 9/2002 | Kang et al. | 257/767 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0146895 A1 | 10/2002 | Ramdani et al. | 438/497 |
| 2002/0151152 A1 | 10/2002 | Shimamoto et al. | 438/398 |
| 2002/0153579 A1 | 10/2002 | Yamamoto | 257/412 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0197402 A1 | 12/2002 | Chiang et al. | 427/255.39 |
| 2003/0013320 A1 | 1/2003 | Kim et al. | 438/778 |
| 2003/0015764 A1 | 1/2003 | Raaijmakers et al. | 257/424 |
| 2003/0031807 A1 | 2/2003 | Elers et al. | 427/569 |
| 2003/0032281 A1 | 2/2003 | Werkhoven et al. | 438/640 |
| 2003/0042630 A1 | 3/2003 | Babcoke et al. | 261/121.1 |
| 2003/0049942 A1 | 3/2003 | Haukka et al. | 438/778 |
| 2003/0060057 A1 | 3/2003 | Raaijmakers et al. | 438/770 |
| 2003/0072975 A1 | 4/2003 | Shero et al. | 428/704 |
| 2003/0082296 A1 | 5/2003 | Elers et al. | 427/96 |
| 2003/0082300 A1 | 5/2003 | Todd et al. | 427/255.27 |

FOREIGN PATENT DOCUMENTS

| | | | | |
|---|---|---|---|---|
| EP | 0 344 352 A1 | 12/1989 | | H01L/39/24 |
| EP | 0 429 270 A2 | 5/1991 | | G03F/7/36 |
| EP | 0 442 290 A1 | 8/1991 | | C30B/25/02 |
| EP | 0 799 641 A2 | 10/1997 | | B01J/20/32 |
| EP | 1 146 141 | 10/2001 | | C23C/16/40 |
| EP | 1 167 569 | 1/2002 | | C23C/16/455 |
| EP | 1 170 804 | 1/2002 | | H01L/29/94 |
| FR | 2.626.110 | 7/1989 | | H01L/39/24 |
| FR | 2.692.597 | 12/1993 | | C23C/16/00 |

| | | | | | | | | |
|---|---|---|---|---|---|---|---|---|
| GB | 2 355 727 A | 5/2001 | ........... C23C/16/44 | JP | 03-185716 Ab | 8/1991 | ......... H01L/21/205 |
| JP | 58-098917 Ab | 6/1983 | ......... H01L/21/205 | JP | 03-208885 Ab | 9/1991 | ........... C30B/23/02 |
| JP | 58-100419 Ab | 6/1983 | ........... H01L/21/20 | JP | 03-234025 Ab | 10/1991 | ........ H01L/21/318 |
| JP | 60-065712 A | 4/1985 | ........... C01B/33/113 | JP | 03-286522 Ab | 12/1991 | ......... H01L/21/205 |
| JP | 61-035847 Ab | 2/1986 | ........... B01J/19/08 | JP | 03-286531 | 12/1991 | ......... H01L/21/316 |
| JP | 61-210623 Ab | 9/1986 | ......... H01L/21/205 | JP | 04-031391 Ab | 2/1992 | ........... C30B/23/08 |
| JP | 62-069508 Ab | 3/1987 | ......... H01L/21/203 | JP | 04-031396 Ab | 2/1992 | ........... C30B/25/14 |
| JP | 62-091495 | 4/1987 | ........... C30B/25/02 | JP | 04-031396 | 2/1992 | ........... C30B/25/14 |
| JP | 62-141717 Ab | 6/1987 | ......... H01L/21/203 | JP | 04-100292 Ab | 4/1992 | ............ H01S/3/18 |
| JP | 62-167297 Ab | 7/1987 | ........... C30B/29/40 | JP | 04-111418 Ab | 4/1992 | ......... H01L/21/205 |
| JP | 62-171999 Ab | 7/1987 | ........... C30B/29/40 | JP | 04-132214 Ab | 5/1992 | ......... H01L/21/205 |
| JP | 62-232919 Ab | 10/1987 | ......... H01L/21/205 | JP | 04-132681 Ab | 5/1992 | ........... C30B/25/14 |
| JP | 63-062313 Ab | 3/1988 | ......... H01L/21/203 | JP | 04-151822 Ab | 5/1992 | ......... H01L/21/205 |
| JP | 63-085098 Ab | 4/1988 | ........... C30B/29/40 | JP | 04-162418 Ab | 6/1992 | ......... H01L/21/205 |
| JP | 63-090833 Ab | 4/1988 | ......... H01L/21/365 | JP | 04-175299 Ab | 6/1992 | ........... C30B/29/68 |
| JP | 63-222420 Ab | 9/1988 | ......... H01L/21/205 | JP | 04-186824 Ab | 7/1992 | ......... H01L/21/205 |
| JP | 63-222421 Ab | 9/1988 | ......... H01L/21/205 | JP | 04-212411 Ab | 8/1992 | ......... H01L/21/203 |
| JP | 63-227007 Ab | 9/1988 | ......... H01L/21/205 | JP | 04-260696 Ab | 9/1992 | ........... C30B/29/40 |
| JP | 63-252420 Ab | 10/1988 | ......... H01L/21/205 | JP | 04-273120 Ab | 9/1992 | ........... H01L/21/20 |
| JP | 63-266814 Ab | 11/1988 | ......... H01L/21/205 | JP | 04-285167 Ab | 10/1992 | ........... C23C/14/54 |
| JP | 64-009895 Ab | 1/1989 | ........... C30B/29/40 | JP | 04-291916 Ab | 10/1992 | ......... H01L/21/205 |
| JP | 64-009896 Ab | 1/1989 | ........... C30B/29/40 | JP | 04-325500 Ab | 11/1992 | ........... C30B/33/00 |
| JP | 64-009897 Ab | 1/1989 | ........... C30B/29/40 | JP | 04-328874 Ab | 11/1992 | ......... H01L/29/804 |
| JP | 64-037832 Ab | 2/1989 | ......... H01L/21/205 | JP | 05-029228 Ab | 2/1993 | ......... H01L/21/205 |
| JP | 64-082615 Ab | 3/1989 | ......... H01L/21/205 | JP | 05-047665 Ab | 2/1993 | ......... H01L/21/205 |
| JP | 64-082617 Ab | 3/1989 | ......... H01L/21/205 | JP | 05-047666 Ab | 2/1993 | ......... H01L/21/205 |
| JP | 64-082671 Ab | 3/1989 | ........... H01L/29/78 | JP | 05-047668 Ab | 2/1993 | ......... H01L/21/205 |
| JP | 64-082676 Ab | 3/1989 | ........... H01L/29/80 | JP | 05-074717 Ab | 3/1993 | ......... H01L/21/205 |
| JP | 01-103982 Ab | 4/1989 | ........... C30B/23/08 | JP | 05-074724 Ab | 3/1993 | ......... H01L/21/205 |
| JP | 01-103996 Ab | 4/1989 | ........... C30B/29/40 | JP | 05-102189 Ab | 4/1993 | ......... H01L/21/336 |
| JP | 64-090524 Ab | 4/1989 | ......... H01L/21/205 | JP | 05-160152 Ab | 6/1993 | ......... H01L/21/336 |
| JP | 01-117017 Ab | 5/1989 | ......... H01L/21/203 | JP | 05-175143 Ab | 7/1993 | ......... H01L/21/205 |
| JP | 01-143221 Ab | 6/1989 | ......... H01L/21/314 | JP | 05-175145 Ab | 7/1993 | ......... H01L/21/205 |
| JP | 01-143233 Ab | 6/1989 | ........... H01L/21/76 | JP | 05-182906 Ab | 7/1993 | ........... H01L/21/20 |
| JP | 01-154511 Ab | 6/1989 | ........... H01L/21/20 | JP | 05-186295 Ab | 7/1993 | ........... C30B/25/02 |
| JP | 01-236657 Ab | 9/1989 | ........... H01L/29/80 | JP | 05-206036 Ab | 8/1993 | ......... H01L/21/205 |
| JP | 01-245512 Ab | 9/1989 | ......... H01L/21/205 | JP | 05-234899 Ab | 9/1993 | ......... H01L/21/205 |
| JP | 01-264218 Ab | 10/1989 | ......... H01L/21/205 | JP | 05-235047 Ab | 9/1993 | ......... H01L/21/338 |
| JP | 01-270593 Ab | 10/1989 | ........... C30B/25/02 | JP | 05-251339 Ab | 9/1993 | ........... H01L/21/20 |
| JP | 01-272108 Ab | 10/1989 | ......... H01L/21/203 | JP | 05-270997 Ab | 10/1993 | ........... C30B/29/68 |
| JP | 01-290221 Ab | 11/1989 | ......... H01L/21/205 | JP | 05-283336 Ab | 10/1993 | ........... H01L/21/20 |
| JP | 01-290222 Ab | 11/1989 | ......... H01L/21/205 | JP | 05-291152 Ab | 11/1993 | ......... H01L/21/205 |
| JP | 01-296673 Ab | 11/1989 | ........... H01L/29/88 | JP | 05-304334 Ab | 11/1993 | ............. H01L/3/18 |
| JP | 01-303770 Ab | 12/1989 | ........... H01L/39/24 | JP | 05-343327 Ab | 12/1993 | ......... H01L/21/205 |
| JP | 01-305894 Ab | 12/1989 | ........... C30B/23/08 | JP | 05-343685 Ab | 12/1993 | ......... H01L/29/784 |
| JP | 01-313927 Ab | 12/1989 | ......... H01L/21/205 | JP | 06-045606 Ab | 2/1994 | ......... H01L/29/784 |
| JP | 02-012814 Ab | 1/1990 | ......... H01L/21/205 | JP | 06-132236 Ab | 5/1994 | ......... H01L/21/205 |
| JP | 02-014513 Ab | 1/1990 | ......... H01L/21/205 | JP | 06-177381 Ab | 6/1994 | ......... H01L/29/784 |
| JP | 02-017634 Ab | 1/1990 | ......... H01L/21/225 | JP | 06-196809 Ab | 7/1994 | ............ H01S/3/18 |
| JP | 02-063115 Ab | 3/1990 | ........... H01L/21/20 | JP | 06-222388 Ab | 8/1994 | ........... G02F/1/136 |
| JP | 02-074029 Ab | 3/1990 | ......... H01L/21/205 | JP | 06-224138 Ab | 8/1994 | ......... H01L/21/205 |
| JP | 02-074587 Ab | 3/1990 | ........... C30B/23/08 | JP | 06-230421 Ab | 8/1994 | ........... G02F/1/136 |
| JP | 02-106822 Ab | 4/1990 | ........... H01B/13/00 | JP | 06-252057 Ab | 9/1994 | ......... H01L/21/205 |
| JP | 02-129913 Ab | 5/1990 | ......... H01L/21/205 | JP | 06-291048 | 10/1994 | ......... H01L/21/205 |
| JP | 02-162717 Ab | 6/1990 | ........... H01L/21/20 | JP | 07-070752 Ab | 3/1995 | ........... C23C/16/40 |
| JP | 02-172895 Ab | 7/1990 | ........... C30B/29/36 | JP | 07-086269 Ab | 3/1995 | ......... H01L/21/314 |
| JP | 02-196092 Ab | 8/1990 | ........... C30B/25/14 | JP | 08-181076 Ab | 7/1996 | ......... H01L/21/205 |
| JP | 02-203517 Ab | 8/1990 | ......... H01L/21/205 | JP | 08-245291 Ab | 9/1996 | ........... C30B/25/14 |
| JP | 02-230690 Ab | 9/1990 | ......... H05B/33/10 | JP | 08-264530 | 10/1996 | ........ H01L/21/3205 |
| JP | 02-230722 Ab | 9/1990 | ......... H01L/21/205 | JP | 09-260786 Ab | 10/1997 | ............ H01S/3/18 |
| JP | 02-246161 Ab | 10/1990 | ......... H01L/29/784 | JP | 09-293681 Ab | 11/1997 | ......... H01L/21/205 |
| JP | 02-264491 Ab | 10/1990 | ............ H01S/3/18 | JP | 10-188840 Ab | 7/1998 | ............ H01J/29/18 |
| JP | 02-283084 Ab | 11/1990 | ............ H01S/3/18 | JP | 10-190128 Ab | 7/1998 | ............ H01S/3/18 |
| JP | 02-304916 Ab | 12/1990 | ......... H01L/21/205 | JP | 10-308283 Ab | 11/1998 | ......... H05B/33/22 |
| JP | 03-019211 Ab | 1/1991 | ......... H01L/21/205 | JP | 11-269652 Ab | 10/1999 | ........... C23C/16/44 |
| JP | 03-022569 Ab | 1/1991 | ......... H01L/29/804 | JP | 2000-031387 Ab | 1/2000 | ............ H01L/27/04 |
| JP | 03-023294 Ab | 1/1991 | ........... C30B/25/18 | JP | 2000-058777 Ab | 2/2000 | ......... H01L/27/108 |
| JP | 03-023299 Ab | 1/1991 | ........... C30B/29/40 | JP | 2000-068072 Ab | 3/2000 | ......... H05B/33/22 |
| JP | 03-044967 Ab | 2/1991 | ........... H01L/29/48 | JP | 2000-087029 Ab | 3/2000 | ........... C09K/11/08 |
| JP | 03-048421 | 3/1991 | ......... H01L/21/302 | JP | 2000-138094 Ab | 5/2000 | ......... H05B/33/10 |
| JP | 03-070124 Ab | 3/1991 | ......... H01L/21/205 | JP | 2000178735 | 6/2000 | ........... C23C/16/08 |

| | | | | |
|---|---|---|---|---|
| JP | 2000-218445 Ab | 8/2000 | ............. | B23P/6/00 |
| JP | 2000-319772 Ab | 11/2000 | ........... | C23C/14/24 |
| JP | 2000-340883 Ab | 12/2000 | ........... | H01S/5/125 |
| JP | 2000-353666 Ab | 12/2000 | ........ | H01L/21/205 |
| JP | 2001-020075 Ab | 1/2001 | ........... | C23C/16/44 |
| JP | 2001-062244 | 3/2001 | ........... | B01D/53/34 |
| JP | 2001111000 | 4/2001 | ......... | H01L/27/105 |
| JP | 2001-152339 Ab | 6/2001 | ........... | C23C/16/40 |
| JP | 2001172767 | 6/2001 | ........... | C23C/16/40 |
| JP | 2001-172767 Ab | 6/2001 | ........... | C23C/16/40 |
| JP | 2001-189312 Ab | 7/2001 | ......... | H01L/21/316 |
| JP | 2001-217206 Ab | 8/2001 | ......... | H01L/21/285 |
| JP | 2001-220287 Ab | 8/2001 | ........... | C30B/25/02 |
| JP | 2001-220294 Ab | 8/2001 | ........... | C30B/29/20 |
| JP | 2001-240972 Ab | 9/2001 | ......... | C23C/16/458 |
| JP | 2001-254181 Ab | 9/2001 | ........... | C23C/16/46 |
| JP | 2001-284042 Ab | 10/2001 | ........... | H05B/33/04 |
| JP | 2001-303251 Ab | 10/2001 | ........... | C23C/16/44 |
| JP | 2001-328900 Ab | 11/2001 | ........... | C30B/29/68 |
| JP | 200260944 | 2/2002 | ........... | C23C/16/30 |
| JP | 200269641 | 3/2002 | ........... | C23C/16/18 |
| JP | 200293804 | 3/2002 | ......... | H01L/21/316 |
| JP | 2002167672 | 6/2002 | ........... | C23C/16/18 |
| WO | 90/02216 | 3/1990 | ........... | C23C/14/34 |
| WO | 91/10510 | 7/1991 | ............ | B01J/37/02 |
| WO | 93/02111 | 2/1993 | ............. | C08F/4/78 |
| WO | 96/17107 | 6/1996 | ........... | C23C/16/44 |
| WO | 96/18756 | 6/1996 | ........... | C23C/16/08 |
| WO | 98/06889 | 2/1998 | | |
| WO | 98/51838 | 11/1998 | ........... | C23C/16/06 |
| WO | WO 99/01595 | 1/1999 | ........... | C30B/25/14 |
| WO | 99/13504 | 3/1999 | ........... | H01L/21/68 |
| WO | 99/29924 | 6/1999 | ........... | C23C/16/04 |
| WO | 99/41423 | 8/1999 | | |
| WO | WO 99/65064 | 12/1999 | ........... | H01L/21/00 |
| WO | 00/11721 | 3/2000 | ........... | H01L/29/43 |
| WO | 00/15865 | 3/2000 | ........... | C23C/16/00 |
| WO | 00/15881 A2 | 3/2000 | | |
| WO | 00/16377 A2 | 3/2000 | | |
| WO | 00/54320 A1 | 9/2000 | ........... | H01L/21/44 |
| WO | 00/63957 A1 | 10/2000 | ......... | H01L/21/205 |
| WO | WO 00/70674 | 11/2000 | ....... | H01L/21/8242 |
| WO | 00/79019 A1 | 12/2000 | ........... | C23C/16/00 |
| WO | 00/79576 A1 | 12/2000 | ......... | H01L/21/205 |
| WO | 01/15220 | 3/2001 | ......... | H01L/21/768 |
| WO | WO 01/17692 | 3/2001 | ........... | B05C/11/00 |
| WO | WO 01/25502 | 4/2001 | ........... | C23C/18/18 |
| WO | 01/27346 A1 | 4/2001 | ........... | C23C/16/44 |
| WO | 01/27347 A1 | 4/2001 | ........... | C23C/16/44 |
| WO | 01/29280 A1 | 4/2001 | ........... | C23C/16/32 |
| WO | 01/29891 A1 | 4/2001 | ......... | H01L/21/768 |
| WO | 01/29893 A1 | 4/2001 | ......... | H01L/21/768 |
| WO | 01/36702 A1 | 5/2001 | ........... | C23C/16/00 |
| WO | 01/40541 A1 | 6/2001 | ........... | C23C/16/40 |
| WO | 01/66832 A2 | 9/2001 | ........... | C30B/25/14 |
| WO | WO 01/82390 | 11/2001 | ........... | H01L/51/20 |
| WO | WO 02/08485 | 1/2002 | ........... | C23C/16/00 |
| WO | WO 02/09167 | 1/2002 | ......... | H01L/21/316 |
| WO | WO 02/27063 | 4/2002 | ........... | C23C/16/40 |
| WO | WO 02/43115 | 5/2002 | | |
| WO | WO 02/45167 | 6/2002 | ........... | H01L/27/00 |
| WO | WO 02/067319 | 8/2002 | ......... | H01L/21/768 |

OTHER PUBLICATIONS

Klaus, et al., "Atomic Layer Deposition of SiO$_2$ Using Catalyzed and Uncatalyzed Self–Limiting Surface Reactions", *Surface Review & Letters*, 6(3&4) (1999), pp. 435–448, (no month avail.).

Yamaguchi, et al., "Atomic–layer chemical–vapor–deposition of silicon dioxide films with extremely low hydrogen content", *Appl. Surf. Sci.*, vol. 130–132 (1998), pp. 202–207, (no month avail.).

George, et al., "Surface Chemistry for Atomic Layer Growth", *J. Phys. Chem.*, vol. 100 (1996), pp. 13121–13131, (no month avail.).

George, et al., "Atomic layer controlled deposition of SiO$_2$ and Al$_2$O$_3$ using ABAB . . . binary reaction sequence chemistry", *Appl. Surf. Sci.*, vol. 82/83 (1994), pp. 460–467, (no month avail.).

Wise, et al., "Diethyldiethoxysilane as a new precursor for SiO$_2$ growth on silicon", *Mat. Res. Soc. Symp. Proc.*, vol. 334 (1994), pp. 37–43, (no month avail).

Niinisto, et al., "Synthesis of oxide thin films and overlayers by atomic layer epitaxy for advanced applications", *Mat. Sci. & Eng.*, vol. B41 (1996), pp. 23–29, (no month avail).

Ritala, et al., "Perfectly conformal TiN and Al$_2$O$_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions". *Appl. Surf. Sci.*, Vol 162–163 (Jul. 1999), pp. 479–491.

Min, et al., "Atomic layer deposition of TiN thin films by sequential introduction of Ti precursor and NH$_3$", *Symp.: Advanced Interconnects and Contact Materials and Processes for Future Integrated Circuits* (Apr. 13–16, 1998), pp. 337–342, (no month avail.).

Min, et al., "Metal–Organic Atomic–Layer Deposition of Titanium–Silicon–Nitride Films", *Applied Physics Letters*, American Inst. of Physics, Vol 75(11) (Sep. 13, 1999).

Maertensson, et al., "Atomic Layer Epitaxy of Copper on Tantalum", *Chemical Vapor Deposition*, 3(1) (Feb. 1, 1997), pp. 45–50.

Ritala, et al. "Atomic Layer Epitaxy Growth of TiN Thin Films", *J. Electrochem. Soc.*, 142(8) (August 1995), pp. 2731–2737.

Elers, et al., "NbCl$_5$ as a precursor in atomic layer epitaxy", *Appl. Surf. Sci.*, vol. 82/83 (1994), pp. 468–474, (no month avail).

Lee, "The Preparation of Titanium–Based Thin Film by CVD Using Titanium Chlorides as precursors", *Chemical Vapor Deposition*, 5(2) (Mar. 1999), pp. 69–73.

Martensson, et al., "Atomic Layer Epitaxy of Copper, Growth & Selectivity in the Cu (II)–2,2,6,6–Tetramethyl–3, 5–Heptanedion ATE/H$_2$ Process", *J. Electrochem. Soc.*, 145(8) (Aug. 1998), pp. 2926–2931.

Min, et al., "Chemical Vapor Deposition of Ti–Si–N Films with Alternating Source Supply", *Mat., Res. Soc. Symp. Proc.*, vol. 564 (Apr. 5, 1999), pp. 207–210.

Bedair, "Atomic layer epitaxy deposition processes", *J. Vac. Sci. Techol.* 12(1) (Jan./Feb. 1994).

Yamaga, et al., "Atomic layer epitaxy of ZnS by a new gas supplying system in a low–pressure metalorganic vapor phase epitaxy", *J. of Crystal Growth* 117 (1992), pp. 152–155, (no month avail.).

Ohba, et al., "Thermal Decomposition of Methylhydrazine and Deposition Properties of CVD TiN Thin Films", Conference proceedings, Advanced Metallization for ULSI Applications in 1993 (1994), pp. 143–149, (no month avail.).

Scheper, et al., "Low–temperature deposition of titanium nitride films from dialkylhydrazine–based precursors", Materials Science in Semiconductor Processing 2 (1999), pp. 149–157, (no month avail.).

Suzuki, et al., "A 0.2–$\mu$m contact filling by 450° C.–hydrazine–reduced TiN film with low resistivity", IEDM 92–979, pp. 11.8.1–11.8.3, (no date avail.).

Suzuki, et al., "LPCVD–TiN Using Hydrazine and TiCl$_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912, (no month avail.).

Solanki, et al., "Atomic Layer deposition of Copper Seed Layers", Electrochemical and Solid State Letters, 3(10) (2000), pp. 479–480, (no month avail.).

NERAC.COM Retro Search: Atomic Layer Deposition of Copper, dated Oct. 11, 2001.

NERAC.COM Retro Search: Atomic Layer Deposition/ Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition, (no date avail).

Abstracts of search results re atomic layer deposition, search dated Jan. 24, 2002.

Abstracts of articles re atomic layer deposition and atomic layer nucleation, (no date avail.).

Abstracts of articles re atomic layer deposition and semiconductors and copper, (no date avail.).

Abstracts of articles—atomic layer deposition, (no date avail.).

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor deposited titanium diboride", J. Appl. Phys. 69(11) (Jun. 1, 1991), pp. 7853–7861.

Choi, et al., "Stability of TiB$_2$ as a Diffusion Barrier on Silicon", J. electrochem. Soc. 138(10) (Oct. 1991), pp. 3062–3067.

Maydan, "Cluster Tools for Fabrication of Advanced devices" Jap. J. of Applied Physics, Extended Abstracts, 22$^{nd}$ Conference Solid State Devices and Materials (1990), pp. 849–852 XP000178141, (no month avail.).

Derbyshire, "Applications of Integrated processing", Solid State Technology, US, Cowan Pub., Vol 37, No. 12 (Dec. 1, 1994), pp. 45–47.

Kitagawa, et al., "Hydrogen–mediated low temperature epitaxy of Si in plasma–enhanced chemical vapor deposition", Applied Surface Science (2000), pp. 30–34, (no month avail.).

Lee, et al., "Pulsed nucleation for ultra–high aspect ratio tungsten plugfill", Novellus Systems, Inc. (2001), pp. 1–2, (no month avail.).

Yang, et al. "Atomic Layer Deposition of Tungsten Film from WF6/B2H6: Nucleation Layer for Advanced Semiconductor Device," Conference Proceedings ULSI XVII (2002) Materials Research Society, (no month avail.).

Klaus, et al. "Atomic Layer Deposition of SiO$_2$ Using Catalyzed and Uncatalyzed Self–Limiting Surface Reactions," Surface Review and Letters, vol. 6, Nos. 3 & 4 (1999) 435–448, (no month avail.).

Rossnagel, et al. "Plasma–enhanced Atomic Layer Deposition of Ta and Ti for Interconnect Diffusion Barriers," J. Vacuum Sci. & Tech. B., vol. 18, No. 4 (Jul. 2000), pp. 2016–2020.

Ritala, et al. "Surface Roughness Reduction in Atomic Layer Epitaxy Growth of Titanium Dioxide Thin Films," Thin Solid–Films, vol. 249, No. 2 (Sep. 15, 1994), pp. 155–162.

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35.

Ritala, et al. "Growth of Titanium Dioxide Thin Films by Atomic Layer Epitaxy," Thin Solid Films, vol. 225, No. 1–2 (Mar. 25, 1993) pp. 288–295.

Ritala, et al. "Effects of Intermediate Zinc Pulses on Properties of TiN and NbN Films by Atomic Layer Epitaxy," Applied Surface Science, vol. 120, No. 3–4, (Dec. 1997), pp. 199–212.

Ritala, et al. "Atomic Layer Epitaxy Growth of TiN Thin Films From TiI$_4$ and NH$_3$," J. Electrochem. Soc., vol. 145, No. 8 (Aug. 1998) pp. 2914–2920.

Proceedings of the ICEEE 1998 International Interconnect Technology Conference—San Francisco, Calif., Jun. 1–3, 1998.

Hwang, et al. "Nanometer–Size $\alpha$–PbO$_2$–type TiO$_2$ in Garnet: A Thermobarometer for Ultrahigh–Pressure Metamorphism" Science Vo. 288 (Apr. 14, 2000).

Kukli, et al., "Tailoring the Dielectric Properties of HfO$_2$—Ta$_2$—O$_5$ Nanotaminates," Applied Physics Letters, vol. 68, No. 26, Jun. 24, 1996; p. 3737–9.

Kukli, et al. "Atomic Layer Epitaxy Growth of Tantalum Oxide Thin Films from Ta(OC$_2$H$_5$)$_5$ and H$_2$O," Journal of the Electrochemical Society, vol. 142, No. 5, May 1995; p. 1670–5.

Kukli, et al., "In situ Study of Atomic Layer Epitaxy Growth of Tantalum Oxide Thin Films From Ta(OC$_2$H$_5$)$_5$ and H$_2$O," Applied Surface Science, vol. 112, Mar. 1997, p. 236–42.

Kukli, et al., "Properties of Ta$_2$O$_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of {Nb$_{1-x}$Ta$_x$}$_2$O$_5$ Solid Solutions and {Nb$_{1-x}$Ta$_x$}$_2$O$_5$—ZrO$_2$ Nanolaminates Grown by Atomic Layer Epitaxy," 1997; p. 785–93, (no month avail).

Ritala, M., et al., "Chemical Vapor Deposition," Jan. 1999, p. 6–9.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001, (no month avail.).

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001), (no month avail).

Hendrix, et al., "Composition Control of $Hf_{1-x}Si_xO_2$ Films Deposited on Si by Chemical–vapor Deposition Using Amide Precursors," Applied Physics Letters, vol. 80, No. 13 (Apr. 1, 2002).

Cheon, et al. "Gas Phase Photoproduction of Diatomic Metal Nitrides During Metal Nitride Laser Chemical Vapor Deposition," Inorg. Chem. 1999, 38, 2238–2239, (no month avail.).

Ohshita, et al. "$HfO_2$ Growth by Low–pressure Chemical Vapor Deposition Using the $Hf(N(C_2H_5)_2)_4/O_2$ Gas System," Journal of Crystal Growth 233 (2001) 292–297, (no month avail).

Balog, et al. "Chemical Vapor Deposition and Characterization of $HfO_2$ Films from Organo–Hafnium Compounds," Thin Solid Films, 41 (1077) 247–259, (no month avail).

Ritala, et al. Ann. Acad. Sci. Fenn. Ser. A II. Chemica 257 (1994) 1–48, (no month avail.).

Kattelus, et al. "Electrical Properties of Tantalum Based Composite Oxide Films," Mat. Res. Soc. Symp. Proc., 284 (1993) 511–516, (no month avail).

Ritala, et al., "Development of Crystallinity and Morphology in Hafnium Dioxide Thin Films Grown by Atomic Layer Epitaxy," Thin Solid Films, vol. 250, No. 1–2, (Oct. 1, 1994), p. 72–80.

Argarwal, et al. "Challenges in Integrating the High–K Gate Dielectric Film to the Conventional CMOS Process Flow," Mat. Sec. Soc. Sump. Proc. vol. 670 (2001), (no month avail).

Ritala, et al. "Atomic Layer Deposition of Oxide Thin Films with Metal Alkoxides as Oxygen Sources," Science vol. 288 Apr. 14, 2000.

Min, et al. "Chemical Vapor Deposition of Ti–Si–N Films With Alternating Source Supply," Mat. Rec. Soc. Symp. Proc. vol. (1999), (no month avail).

Hiramatsu, et al. "Formation of TiN films with low Cl concentration by pulsed plasma chemical vapor deposition," J. Vac. Sci. Technolo. A, vol. 14, No. 3, (May/Jun 1996), p. 1037–1040.

CYCLICAL DEPOSITION OF A VARIABLE CONTENT TITANIUM SILICON NITRIDE LAYER

BACKGROUND OF THE INVENTION

1. Field of the Invention

Embodiments of the present invention generally relate to an apparatus and method of depositing a titanium silicon nitride layer. More particularly, embodiments of the present invention relate to an apparatus and method of depositing a variable content titanium silicon nitride layer by cyclical deposition.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1. Therefore, there is a great amount of ongoing effort being directed at the formation of substantially void-free and seam-free sub-micron features having high aspect ratios.

Currently, copper and its alloys have become the metals of choice for sub-micron interconnect technology because copper has a lower resistivity than aluminum, (1.7 $\mu\Omega$-cm compared to 3.1 $\mu\Omega$-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

However, one problem with the use of copper is that copper diffuses into silicon, silicon dioxide, and other dielectric materials which may compromise the integrity of devices. Therefore, conformal barrier layers become increasingly important to prevent copper diffusion. Titanium silicon nitride is one material being explored for use as a barrier material to prevent the diffusion of copper into underlying layers. One problem with prior titanium silicon nitride barrier layers is that the silicon in titanium silicon nitride may react with the copper to form copper silicide, which has a high resistance and, thus, increases the resistance of the interconnect.

Therefore, there is a need for an improved barrier layer for use in metallization of interconnects.

SUMMARY OF THE INVENTION

Embodiments of the invention relate to an apparatus and method of depositing a titanium silicon nitride layer by cyclical deposition. In one aspect, a titanium silicon nitride layer having a variable content or a controlled composition of titanium, silicon, and nitrogen through the depth of the layer may be formed. One embodiment of this variable content titanium silicon nitride layer or tuned titanium silicon nitride layer includes a bottom sub-layer of $TiSi_{X1}N_{Y1}$, a middle sub-layer of $TiSi_{X2}N_{Y2}$, and a top sub-layer of $TiSi_{X3}N_{Y3}$ in which X1 is less than X2 and X3 is less than X2. Another embodiment of a variable content titanium silicon nitride layer includes a bottom sub-layer of $TiSi_{X1}N_{Y1}$ and a top sub-layer of $TiSi_{X2}N_{Y2}$ in which X2 is greater than X1. Still another embodiment of a variable content titanium silicon nitride layer includes a bottom sub-layer of $TiSi_{X1}N_{Y1}$, a middle sub-layer of $TiSi_{X2}N_{Y2}$, and a top sub-layer of $TiSi_{X3}N_{Y3}$ in which X1 is greater than X2 and X3 is greater than X2.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

One embodiment of the present method involves cyclical deposition of the ternary material of titanium silicon nitride by delivering three precursors to a substrate in which delivery of two of the three precursors at least partially overlap. The term "ternary material" as used herein is defined as a material comprising three major elements. Thus, the ternary material of titanium silicon nitride comprises titanium atoms, silicon atoms, and nitrogen atoms. The term "cyclical deposition" as used herein refers to the sequential introduction of one or more compounds to deposit a thin layer over a structure and includes processing techniques such as atomic layer deposition and rapid sequential chemical vapor deposition. Compounds can be reactants, reductants, precursors, catalysts, and mixtures thereof. The sequential introduction of compounds may be repeated to deposit a plurality of thin layers forming a conformal layer to a desired thickness.

Figure 1A:
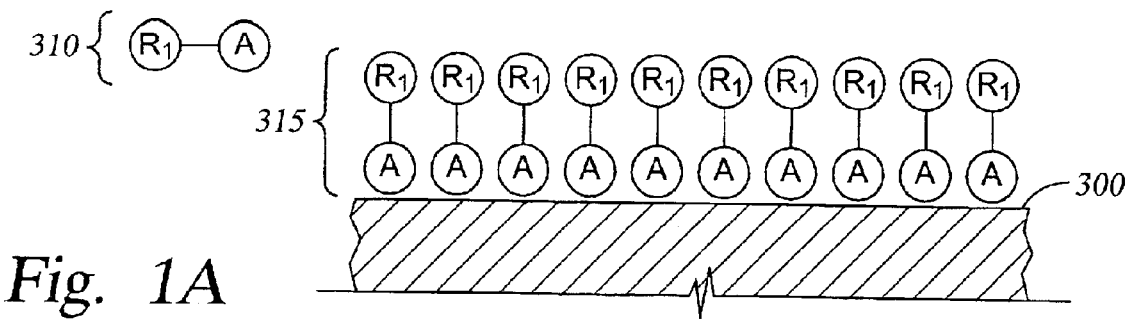
FIGS. 1A–C are simplified cross-sectional views illustrating one embodiment of exposing a substrate structure to three precursors in which delivery of two of the three precursors at least partially overlap.
Figure 1B:
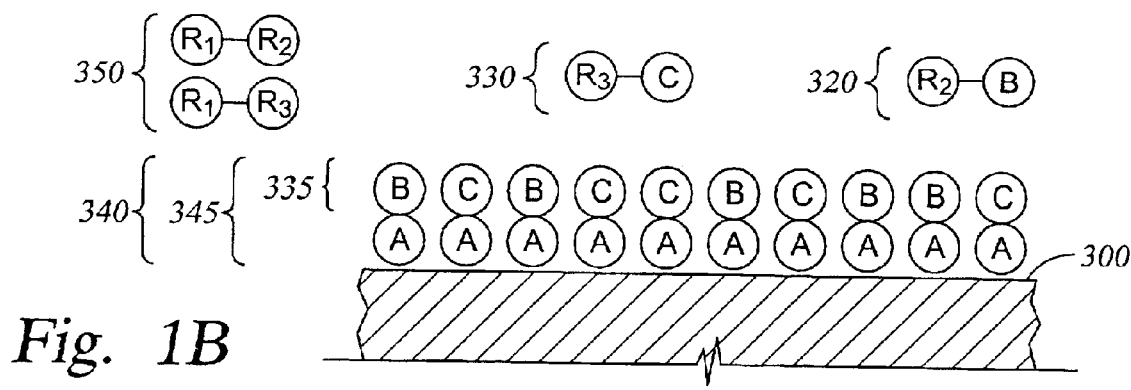
Figure 1C:
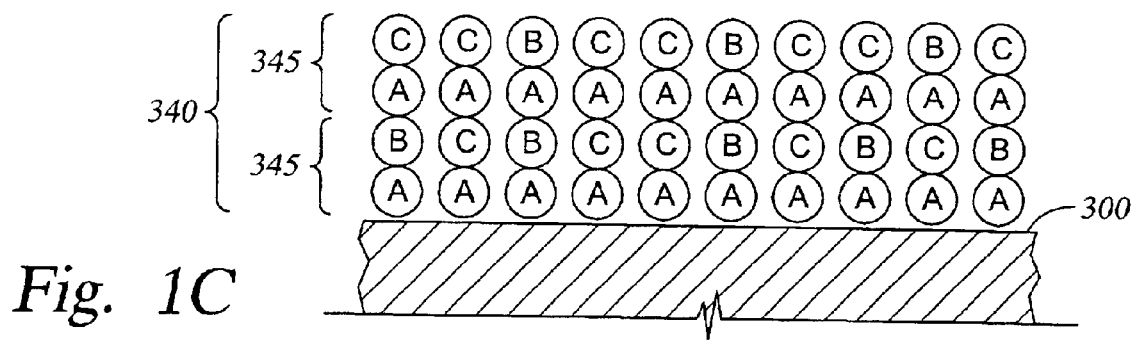

The composition and structure of precursors on a surface during cyclical deposition is not precisely known. Not wishing to be bound by theory, FIGS. 1A–C are simplified cross-sectional views illustrating one embodiment of exposing the substrate structure 300 to three precursors in which delivery of two of the three precursors at least partially overlap. The substrate structure 300 refers to any workpiece upon which film processing is performed and may be used to denote a substrate, such as a semiconductor substrate or a glass substrate, as well as other material layers formed on the substrate, such as a dielectric layer.

In FIG. 1A, a first precursor 310 is adsorbed on the substrate structure 300 by introducing a pulse of the first precursor 310 into a process chamber. The first precursor 310 may comprise atoms of an element (labeled as A) with one or more reactive species (labeled as $R_1$). The first precursor may be delivered with or without a carrier gas. Examples of carrier gases which may be used include, but are not limited to, helium (He), argon (Ar), nitrogen ($N_2$), hydrogen ($H_2$), and mixtures thereof. A layer 315, which may be about a monolayer or may be more or less than a monolayer, of the first precursor 310 may be adsorbed onto the surface of the substrate structure 300 during a given pulse. Any of the first precursor 310 not adsorbed will flow out of the chamber as a result of the vacuum system, carrier gas flow, and/or purge gas flow. The terms "adsorption" or "adsorb" as used herein are intended to include chemisorption, physisorption, or any attractive and/or bonding forces which may be at work and/or which may contribute to the bonding, reaction, adherence, or occupation of a portion of an exposed surface of a substrate structure.

After the pulse of the first precursor 310 is introduced into the chamber, a purge gas is introduced. Examples of purge gases which may be used include, but are not limited to, helium (He), argon (Ar), nitrogen ($N_2$), hydrogen ($H_2$), and mixtures thereof. The purge gas may be delivered as a pulse or may be delivered as a continuous flow into the chamber. The purge gas and the carrier gas may comprise different gas flows or may comprise the same gas flow. If the purge gas and the carrier gas comprise different gas flows, the purge gas and the carrier gas preferably comprise the same type of gas.

Referring to FIG. 1B, after a purge gas has been introduced, a pulse of a second precursor 320 and a pulse of a third precursor 330 are delivered into the process chamber in which the pulse of the second precursor 320 and the pulse of the third precursor 330 at least partially overlap in time. The second precursor 320 may comprise atoms of an element (labeled as B) with one or more reactive species (labeled as $R_2$) and the third precursor 330 may comprise atoms of an element (labeled as C) with one or more reactive species (labeled as $R_3$). The second precursor 320 and the third precursor 330 may be delivered with or without a carrier gas. Examples of carrier gases which may be used include, but are not limited to, helium (He), argon (Ar), nitrogen ($N_2$), hydrogen ($H_2$), and mixtures thereof.

It is believed that the second precursor 320 and the third precursor 330 compete with one another to adsorb onto and to react with the first precursor 310. The reaction of the first precursor 310 with the second precursor 320 and the reaction of the first precursor 310 with the third precursor 330 forms a ternary compound 340 comprising element A, element B, and element C and forms by-products 350. The amount of the second precursor 320 reacting with the first precursor 310 in comparison to the amount of the third precursor 330 reacting with the first precursor 310 depends, along with other factors discussed herein, on the ratio of the second precursor versus the third precursor introduced into the chamber. Therefore, a layer 335, which may be about a monolayer or may be more or less than a monolayer, of the combination of the second precursor 320 and the third precursor 330 may adsorb on the first precursor 310 and a layer 345 of the ternary compound 340 may form during one cycle. Therefore, sequential delivery of pulses of a first precursor, a second precursor, and a third precursor, in which pulses of the second precursor and the pulses of the third precursor at least partially overlap in time, is believed to result in the alternating adsorption of a layer of a first precursor and of a layer of a second precursor and a third precursor to form a layer of a ternary material.

After a pulse of the second precursor 320 and the third precursor 330, a purge gas is introduced. Thereafter, as shown in FIG. 1C, the cycle of delivering three precursor to the substrate structure 300 may be repeated, if necessary, until a desired thickness of the ternary material 340 is achieved. In general, the composition of the ternary material 340 may be represented by the following expression $AB_XC_Y$ in which the atomic ratio of element A to element B to element C is 1:X:Y in which X and Y may be any fraction including whole numbers, or mixed numbers.

In FIGS. 1A–1C, formation of the ternary material layer is depicted as starting with the adsorption of a layer of the first precursor 310 on the substrate structure 300 followed by a layer of the combination of the second precursor 320 and the third precursor 330. Alternatively, formation of the ternary material layer may start with the adsorption of a layer of the combination of the second precursor 320 and the third precursor 330 on the substrate structure 300 followed by adsorption of a layer of the first precursor 310. In another theory, the precursors may be in an intermediate state when on a surface of the substrate. In addition, the deposited ternary compound 340 may also contain more than simply element A, element B, and element C due to other elements and/or by-products incorporated into the film. Furthermore, one or more of the precursors may be plasma enhanced. However, the second precursor 320 and the third precursor 330 are preferably introduced without a plasma to reduce the likelihood of co-reaction between the second precursor 320 and the third precursor 330.

The amount of element B and the amount of element C in the ternary material may be varied by adjusting one or more variety of parameters. For example, the flow ratio of element B to element C between cycles may be varied. The flow ratio of element B to element C is not necessarily a one-to-one relationship of the amount of element B and element C incorporated into the ternary material. Other parameters which may affect incorporation of element B and element C in the ternary material include the substrate temperature, the pressure, and the amount and sequence of the overlap of element B to element C. Furthermore, the composition of the ternary material layer may be tuned so that the ternary material layer may comprise varying amounts of the three elements through the depth of the ternary material layer which is described in further detail elsewhere herein.

Preferably, there is a co-reaction of the first precursor 310 with the second precursor 320 and a co-reaction of the first precursor 310 with the third precursor 330 with a limited or no co-reaction of the second precursor 320 with the third precursor 330 to limit gas phase reactions between the second precursor 320 and the third precursor 330. The deposition of the ternary compound may proceed by sequential delivery of pulses of a first precursor 310, a second precursor 320, and the third precursor 330, in which pulses of the second precursor 320 and a third precursor 330 at least partially overlap in time, to the substrate structure 300. The second precursor and the third precursor may be introduced through the chamber lid assembly through separate flow paths by separate valves or may be introduced through the chamber lid assembly through the same flow path by the same valve or separate valves. Preferably, the second precursor and the third precursor are introduced into the chamber by separate valves in fluid communication with separate flow paths through the chamber lid assembly.

Figure 2A:
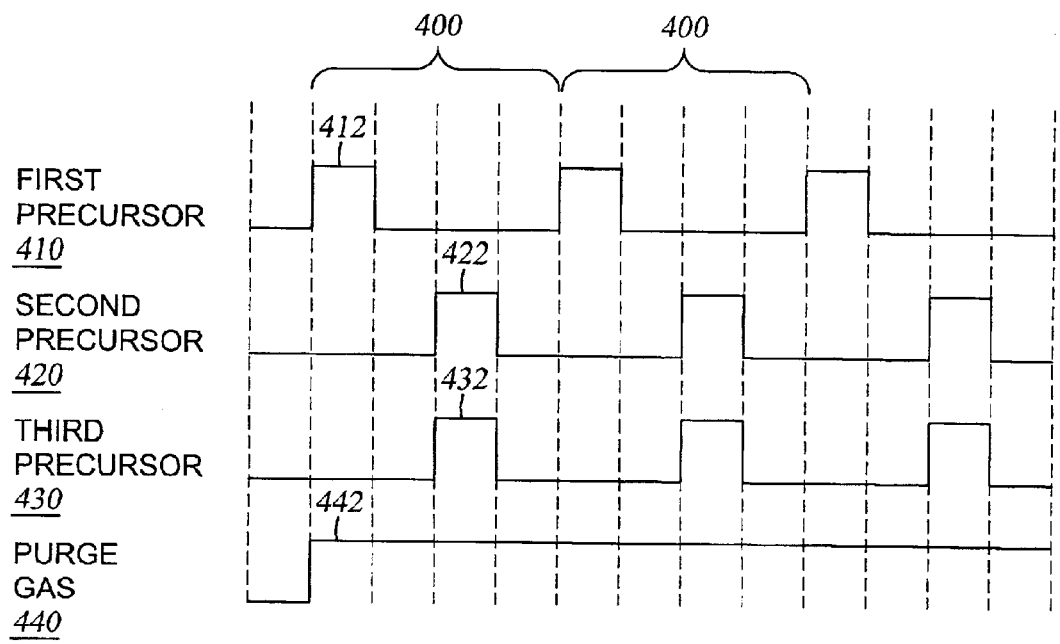
FIGS. 2A–2D and 2F are graphs of exemplary processes of sequential delivery of pulses of a first precursor, a second precursor, and a third precursor in which the pulses of the second precursor and the third precursor at least partially overlap in time.

FIG. 2A is a graph of an exemplary process of sequential delivery of pulses of a first precursor, a second precursor, and a third precursor in which the pulses of the second precursor and the third precursor at least partially overlap in time. One cycle 400 of sequential delivery comprises providing a continuous flow 442 of a purge gas 440 to the chamber. During the continuous flow 442 of the purge gas 440, a pulse 412 of a first precursor 410 is introduced into the chamber and dosed into the stream of the continuous flow 442 of the purge gas 440 by opening and closing a valve providing the first precursor. After the pulse 412 of the first precursor 410, the flow 442 of the purge gas 440 continues into the chamber without any precursor introduced into the chamber. Then, during the continuous flow 442 of the purge gas 440, a pulse 422 of a second precursor 420 and a pulse 432 of a third precursor 430 are introduced simultaneously into the chamber and are dosed into the stream of the continuous flow 442 of the purge gas 440 by opening a valve providing the second precursor and a valve providing the third precursor substantially at the same time and, then, by closing the valve providing the second precursor and the valve providing the third precursor substantially at the same. After the pulse 422 of the second precursor 420 and the pulse 432 of the third precursor 430, the flow 442 of the purge gas 440 continues into the chamber without any precursors introduced into the chamber. The cycle 400 may be repeated to deposit a desired thickness of the ternary material layer.

Figure 2B:
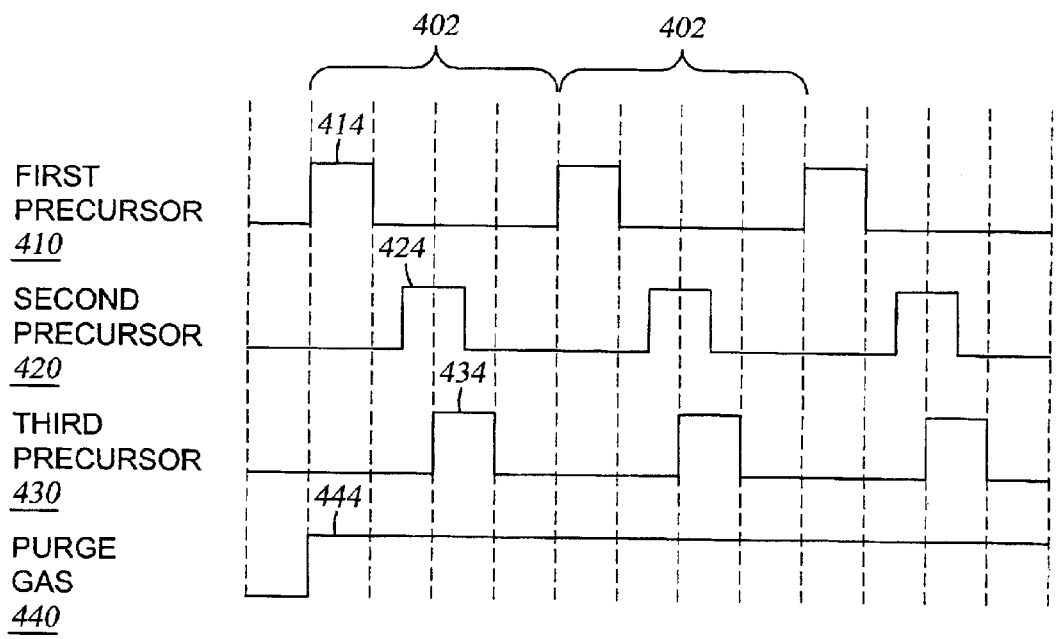

FIG. 2B is a graph of another exemplary process of sequential delivery of pulses of a first precursor, a second precursor, and a third precursor in which the pulses of the second precursor and the third precursor at least partially overlap in time. One cycle 402 comprises providing a continuous flow 444 of a purge gas 440 to the chamber. During the continuous flow 444 of the purge gas 440, a pulse 414 of a first precursor 410 is introduced into the chamber and dosed into the stream of the continuous flow 444 of the purge gas 440 by opening and closing a valve providing the first precursor. After the pulse 414 of the first precursor 410, the flow 444 of the purge gas 440 continues into the chamber without any precursors introduced into the chamber. Then, during the continuous flow 444 of the purge gas 440, a pulse 424 of a second precursor 420 is introduced into the chamber and dosed into the stream of the continuous flow 444 of the purge gas 440 by opening a valve providing the second precursor. Prior to the end of the pulse 424 of the second precursor 420, a pulse 434 of a third precursor is introduced into the chamber and dosed into the stream of the continuous flow 444 of the purge gas 440 by opening a valve providing the third precursor. Then, the valve providing the second precursor is closed followed by closing the valve providing the third precursor. After the pulse 434 of the third precursor 430, the flow 444 of the purge gas 440 continues into the chamber without any precursors introduced into the chamber. The cycle 402 may be repeated to deposit a desired thickness of the ternary material layer.

Figure 2C:
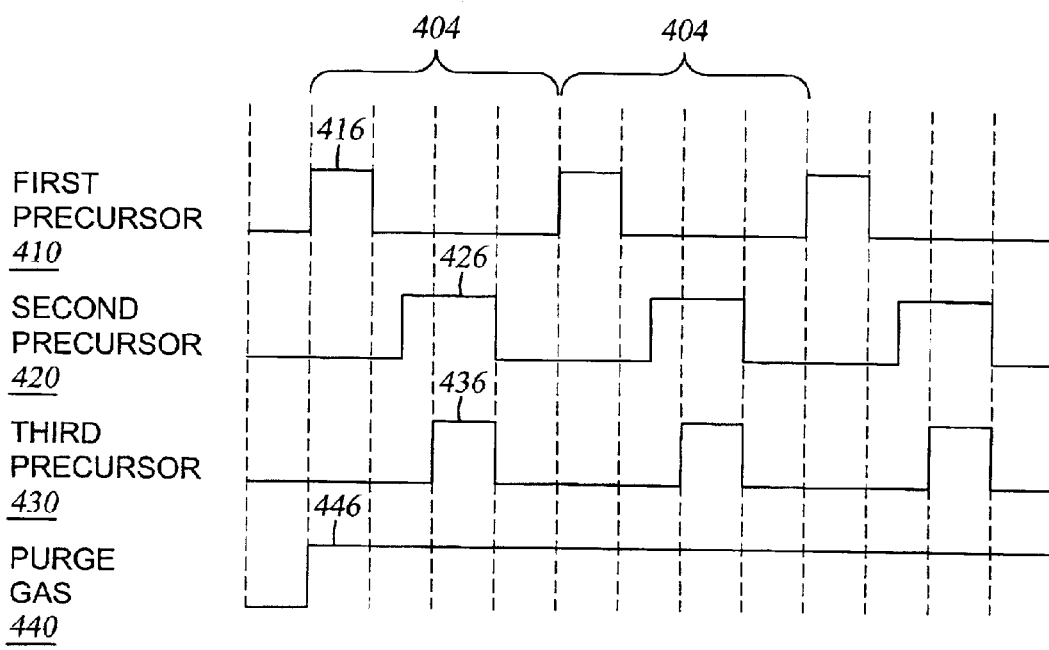

FIG. 2C is a graph of still another exemplary process of sequential delivery of pulses of a first precursor, a second precursor, and a third precursor in which the pulses of the second precursor and the third precursor at least partially overlap in time. One cycle 404 comprises providing a continuous flow 446 of a purge gas 440 to the chamber. During the continuous flow 446 of the purge gas 440, a pulse 416 of a first precursor 410 is introduced into the chamber and dosed into the stream of the continuous flow 446 of the purge gas 440 by opening and closing a valve providing the first precursor. After the pulse 416 of the first precursor 410, the flow 446 of the purge gas 440 continues into the chamber without any precursors introduced into the chamber. Then, during the continuous flow 446 of the purge gas 440, a pulse 426 of a second precursor 420 is bled into the chamber prior to a pulse 436 of a third precursor 430 and dosed into the stream of the continuous flow 446 of the purge gas 440 by opening a valve providing the second precursor. The pulse 436 of the third precursor 430 is then introduced into the chamber and dosed into the stream of the continuous flow 446 of the purge gas 440 by opening a valve providing the third precursor. Then, the valve providing the second precursor and the valve providing the third precursor are closed substantially at the same time. After the pulse 426 of the second precursor 420 and the pulse 436 of the third precursor 430, the flow 446 of the purge gas 440 continues into the chamber without any precursors introduced into the chamber. The cycle 404 may be repeated to deposit a desired thickness of the ternary material layer.

Figure 2D:
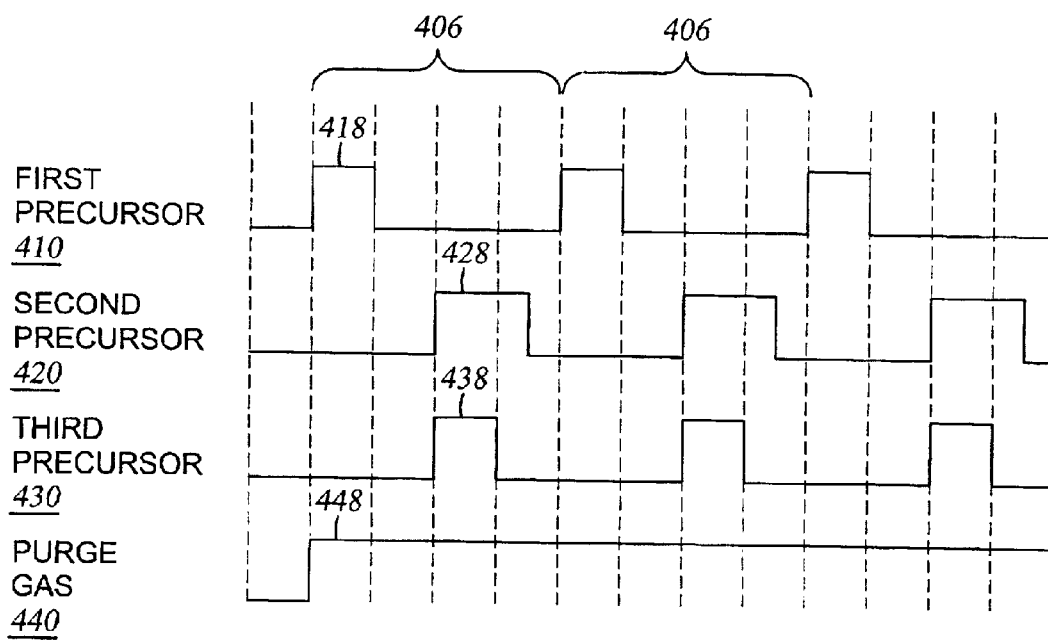

FIG. 2D is a graph of still another exemplary process of sequential delivery of pulses of a first precursor, a second precursor, and a third precursor in which the pulses of the second precursor and the third precursor at least partially overlap in time. One cycle 406 comprises providing a continuous flow 448 of a purge gas 440 to the chamber. During the continuous flow 448 of the purge gas 440, a pulse 418 of a first precursor 410 is introduced into the chamber and dosed into the stream of the continuous flow 448 of the purge gas 440 by opening and closing a valve providing the first precursor. After the pulse 418 of the first precursor 410, the flow 448 of the purge gas 440 continues into the chamber without any precursors introduced into the chamber. Then, during the continuous flow 448 of the purge gas 440, a pulse 428 of a second precursor 420 and a pulse 438 of a third precursor 430 are introduced simultaneously into the chamber and dosed into the stream of the continuous flow 448 of the purge gas 440 by opening a valve providing the second precursor and a valve providing the third precursor substantially at the same. The pulse 428 of the second precursor 420 is dragged behind the pulse 438 of the third precursor 430 by closing the valve providing the third precursor prior to closing the valve providing the second precursor. After the pulse 428 of the second precursor 420, the flow 448 of the purge gas 440 continues into the chamber without any precursors introduced into the chamber. The cycle 406 may be repeated to deposit a desired thickness of the ternary material layer.

Figure 2E:
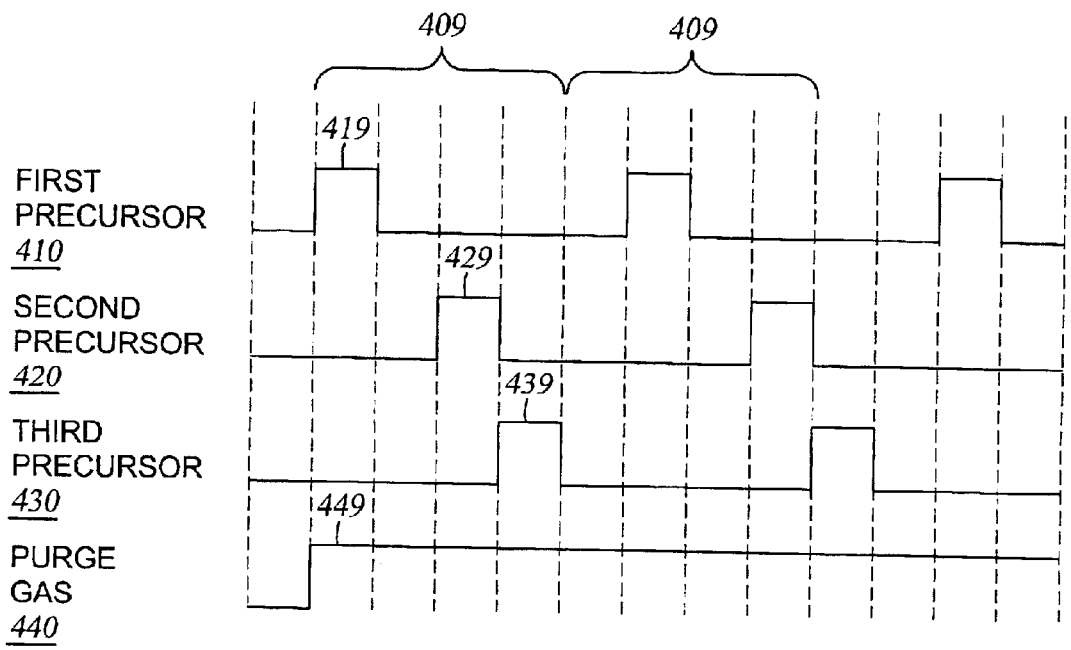
FIG. 2E is a graph of one exemplary process of sequentially delivering a first precursor, a second precursor, and a third precursor in which there is no purge gas which separates the flow of the second precursor and the third precursor.

FIG. 2E is a graph of one exemplary process of sequentially delivering a first precursor, a second precursor, and a third precursor within the scope of the present invention. One cycle 409 comprises providing a continuous flow 449 of a purge gas 440 to the chamber. During the continuous flow 449 of the purge gas 440, a pulse 419 of a first precursor 410 is introduced into the chamber and dosed into the stream of the continuous flow 449 of the purge gas 440 by opening and closing a valve providing the first precursor. After the pulse 419 of the first precursor 410, the flow 449 of the purge gas 440 continues into the chamber without any precursors introduced into the chamber. Then, during the continuous flow 449 of the purge gas 440, a pulse 429 of a second precursor 420 is introduced into the chamber and dosed into the stream of the continuous flow 449 of the purge gas 440 by opening a valve providing the second precursor. At the end of the pulse 429 of the second precursor, a pulse 439 of a third precursor 430 is introduced into the chamber and dosed into the stream of the continuous flow 449 of the purge gas 440 by closing a valve providing the second precursor and by opening a valve providing the third precursor substantially at the same time. Then, the valve providing the third precursor is closed. After the pulse 439 of the third precursor 430, the flow 449 of the purge gas 440 continues into the chamber without any precursors introduced into the chamber. The cycle 409 may be repeated to deposit a desired thickness of the ternary material layer.

Referring to FIG. 2A, in one embodiment, the pulse 412 of the first precursor 410 is evacuated from a processing zone adjacent the substrate prior to introduction of the pulse 422 of the second precursor 420 and the pulse 432 of the third precursor 430. In another embodiment, the pulse 412 of the first precursor 410 along with the pulse 422 of the second precursor 420 and the pulse 432 of the third precursor 430 may be present at the same time in a processing zone adjacent the substrate in which the pulse 412 of the first precursor 410 is at one portion of the substrate and the pulse 422 of the second precursor 420 and the pulse 432 of the third precursor 430 are at another portion of the substrate. Similarly in reference to FIGS. 2B–2E, the pulse of the first precursor and the pulses of the second and third precursors may be present in the processing zone separately or may be present in the processing zone together with the pulse of the first precursor at one portion of the substrate and the pulse of the second precursor and the third precursor at another portion of the substrate.

FIGS. 2A–2D are graphs of exemplary processes of sequential delivery of pulses of a first precursor, a second precursor, and a third precursor in which the pulses of the second precursor and the third precursor at least partially overlap in time. Other embodiments of sequential delivery of pulses of a first precursor, a second precursor, and a third precursor, in which the pulses of the second precursor and the third precursor at least partially overlap in time, are within the scope of the present disclosure. Not wishing to be bound by theory, it is believed sequential delivery of pulses of a first precursor, a second precursor, and a third precursor, in which the pulses of the second precursor and the third precursor at least partially overlap in time, may provide a true ternary material layer comprising layers containing at the atomic level elements of the first precursor, the second precursor, and the third precursor. Not wishing to be bound by theory, it is believed that for sequential introduction of three precursors in which the pulses do not overlap in time (i.e., a first precursor is introduced, followed by the second precursor, followed by the third precursor or first precursor is introduced, followed by the second precursor, followed by the first precursor, followed by the third precursor), it is uncertain whether there is formation of a layer comprising amounts of elements A, B, and C. It is also believed that delivering pulses of a second precursor and a third precursor, in which the pulses of the second precursor and the third precursor at least partially overlap in time, aids in reducing the amount of precursor impurities incorporated into the deposited film due to the competitive nature of the second precursor versus the third precursor for the first precursor. In another aspect, cyclical deposition of a ternary material of three elements by exposing the substrate to three precursors in which the delivery of pulses of two of the three precursors at least partially overlap increases the throughput of cyclical deposition in comparison to a sequential introduction of pulses of three precursors without any overlap of the pulses.

FIG. 2E is a graph of one exemplary process of sequentially delivering a first precursor, a second precursor, and a third precursor in which there is no purge gas which separates the flow of the second precursor and the third precursor. Not wishing to be bound by theory, although pulses of the second precursor and the third precursor do not overlap, it is believed that sequentially delivering a first precursor, a second precursor, and a third precursor in which there is no purge gas which separates the flow of the second precursor and the third precursor may provide conformal growth of a ternary material layer with improved throughput in comparison to prior processes of sequentially introducing multiple precursors. Other embodiments of sequentially delivering three or more precursors in which at least two of the precursors are not separated by a flow of a purge gas are possible.

Figure 2F:
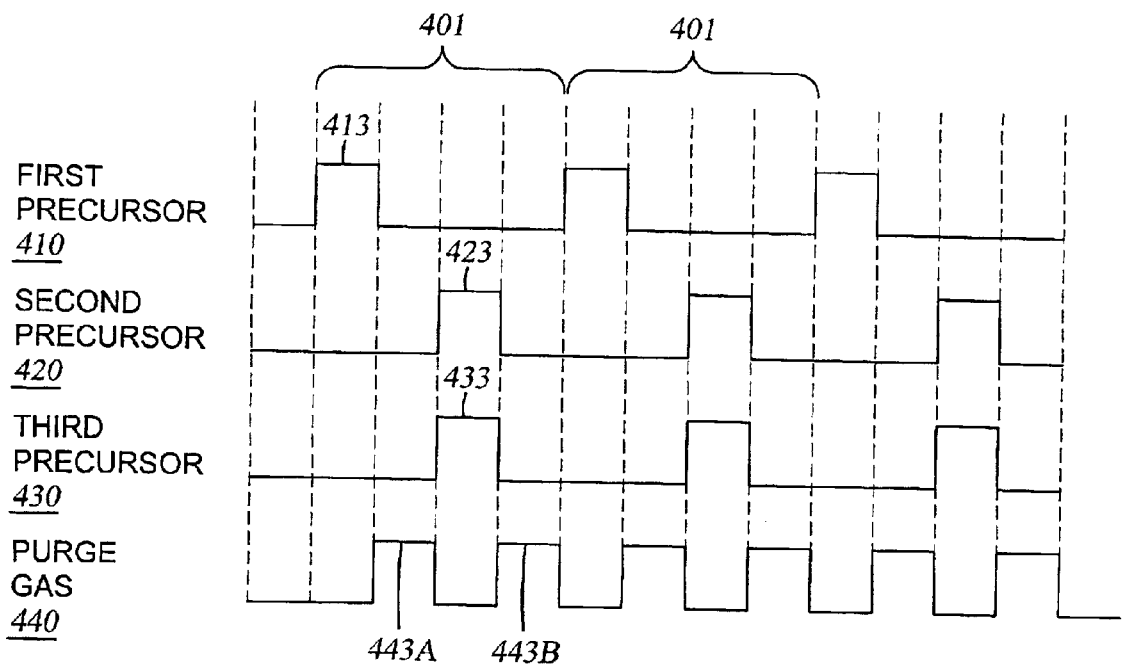

The processes as described in referenced to FIGS. 2A–2E comprise providing a continuous purge gas. The processes as disclosed herein may also comprise providing a purge gas in pulses. For example, FIG. 2F is a graph of an exemplary process similar to the process as described in FIG. 2A in which the purge gas is delivered in pulses. One cycle 401 of sequential delivery of pulses of a first precursor, a second precursor, and a third precursor, in which the pulses of the second precursor and the third precursor at least partially overlap in time, comprises introducing a pulse 413 of a first precursor 410 into the chamber by opening and closing a valve providing the first precursor. After the pulse 413 of the first precursor 410, a pulse 443A of a purge gas 440 is introduced into the chamber by opening and closing a valve providing the purge gas. After the pulse 443A of the purge gas 440, a pulse 423 of a second precursor 420 and a pulse 433 of a third precursor 430 are introduced simultaneously into the chamber by opening a valve providing the second precursor and a valve providing the third precursor substantially at the same time and, then, by closing the valve providing the second precursor and the valve providing the third precursor substantially at the same. After the pulse 423 of the second precursor 420 and the pulse 433 of the third precursor 430, another pulse 443B of the purge gas 440 is introduced into the chamber by opening and closing the valve providing the purge gas. The cycle 401 may be repeated to deposit a desired thickness of the ternary material layer. In other embodiments, introduction of the pulses of the purge gas may overlap with the pulses of the precursors.

FIGS. 2A–2F show each cycle starting with delivery of a pulse of a first precursor followed by delivery of a pulse of a second precursor and a pulse of a third precursor. Alternatively, formation of a ternary material layer may start with the delivery of a pulse of a second precursor and a pulse of a third precursor followed by a pulse of a first precursor. FIGS. 2A–2F show the duration of pulses of precursors and/or a purge gas provided over a relative length of time. In other embodiments, other relative lengths of time are possible for the duration of the pulses. In addition, FIGS. 2A–2E show introducing a pulse of a first precursor and providing a continuous flow of a purge gas in which the continuous flow is started at the same time as the pulse of a first precursor. In other embodiments, a continuous flow of a purge gas may be established prior to any precursor being introduced.

Cyclical deposition of titanium silicon nitride may also be performed by any other cyclical deposition methods. For example, cyclical deposition of titanium silicon nitride may be provided by sequentially providing pulses of three precursors in which a pulse of a first precursor is introduced, followed by a pulse of a second precursor, followed by a pulse of a third precursor in which each pulse of a precursor is separated by a continuous flow of a purge gas or a pulse of a purge gas. In another example, cyclical deposition of titanium silicon nitride may be provided by sequentially providing pulses of three precursors in which a pulse of a first precursor is introduced, followed by a pulse of a second precursor, followed by a pulse of a first precursor, followed by a pulse of third precursor in which each pulse of a precursor is separated by a continuous flow of a purge gas or a pulse of a purge gas. Cyclical deposition of titanium silicon nitride may also be performed with more than three reactants. For example, titanium silicon nitride may be deposited by cyclical deposition utilizing a titanium precursor, a silicon precursor, a nitrogen precursor, and a hydrogen plasma.

Titanium silicon nitride ($TiSi_xN_y$) may be formed by cyclical deposition utilizing a titanium precursor, a silicon precursor, and a nitrogen precursor. The titanium silicon nitride ($TiSi_xN_y$) may comprise titanium to silicon to nitrogen in a ratio in which "X" is between about 0.0 and about 2.0 and in which "Y" is between about 0.0 and about 1.0. In one embodiment, titanium silicon nitride ($TiSi_xN_y$) may be formed by providing pulses of the silicon precursor and the nitrogen precursor, in which the pulses of the silicon precursor and the nitrogen precursor at least partially overlap. In other embodiments, titanium silicon nitride ($TiSi_xN_y$) may be formed by in introducing pulses of precursor in which the pulses of other precursors at least partially overlap or may be formed by introducing pulses of reactants separately.

The titanium precursor preferably comprises titanium tetrachloride ($TiCl_4$). Examples of other titanium containing compounds include, but are not limited to, titanium iodide ($TiI_4$), titanium bromide ($TiBr_4$), other titanium halides, tetrakis(dimethylamino)titanium (TDMAT), tetrakis (diethylamino)titanium (TDEAT), other titanium organic compounds, and derivatives thereof. The silicon precursor preferably comprises silane ($SiH_4$) to reduce the likelihood of a co-reaction between the silicon precursor and the nitrogen precursor. Other silicon containing compounds include, but are not limited to disilane ($Si_2H_6$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), and derivatives thereof. The nitrogen precursor preferably comprises ammonia ($NH_3$). Examples of other nitrogen precursors include, but are not limited to hydrazine ($N_2H_4$), other $N_xH_y$ compounds with x and y being integers, dimethyl hydrazine (($CH_3)_2N_2H_2$), t-butylhydrazine ($C_4H_9N_2H_3$), phenylhydrazine ($C_6H_5N_2H_3$), 2,2'-azoisobutane (($CH_3)_6C_2N_2$), ethylazide ($C_2H_5N_3$), and derivatives thereof.

Figure 3:
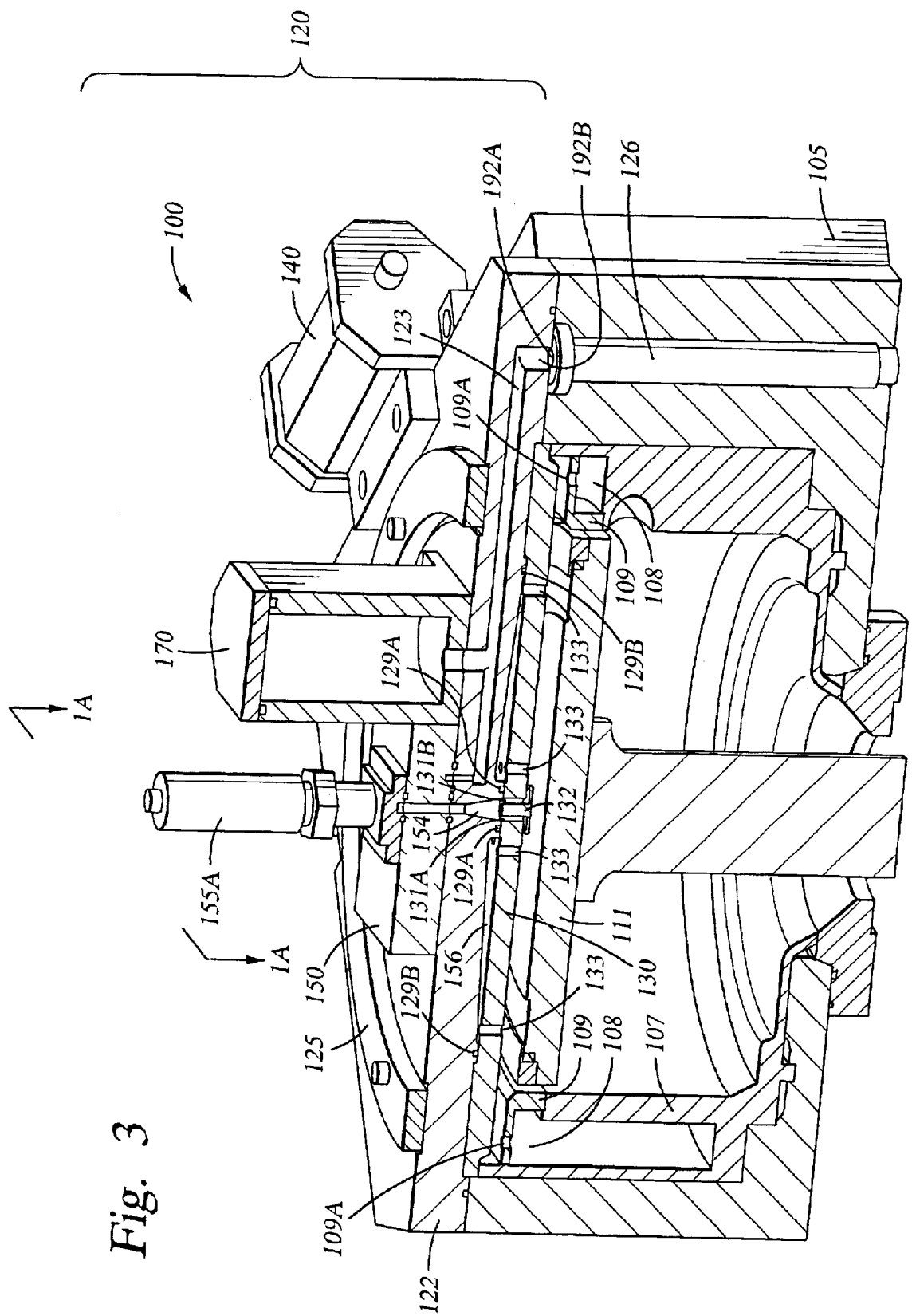
FIG. 3 is a partial cross-sectional view of one embodiment of a processing system adapted to perform cyclical deposition.
Figure 3A:
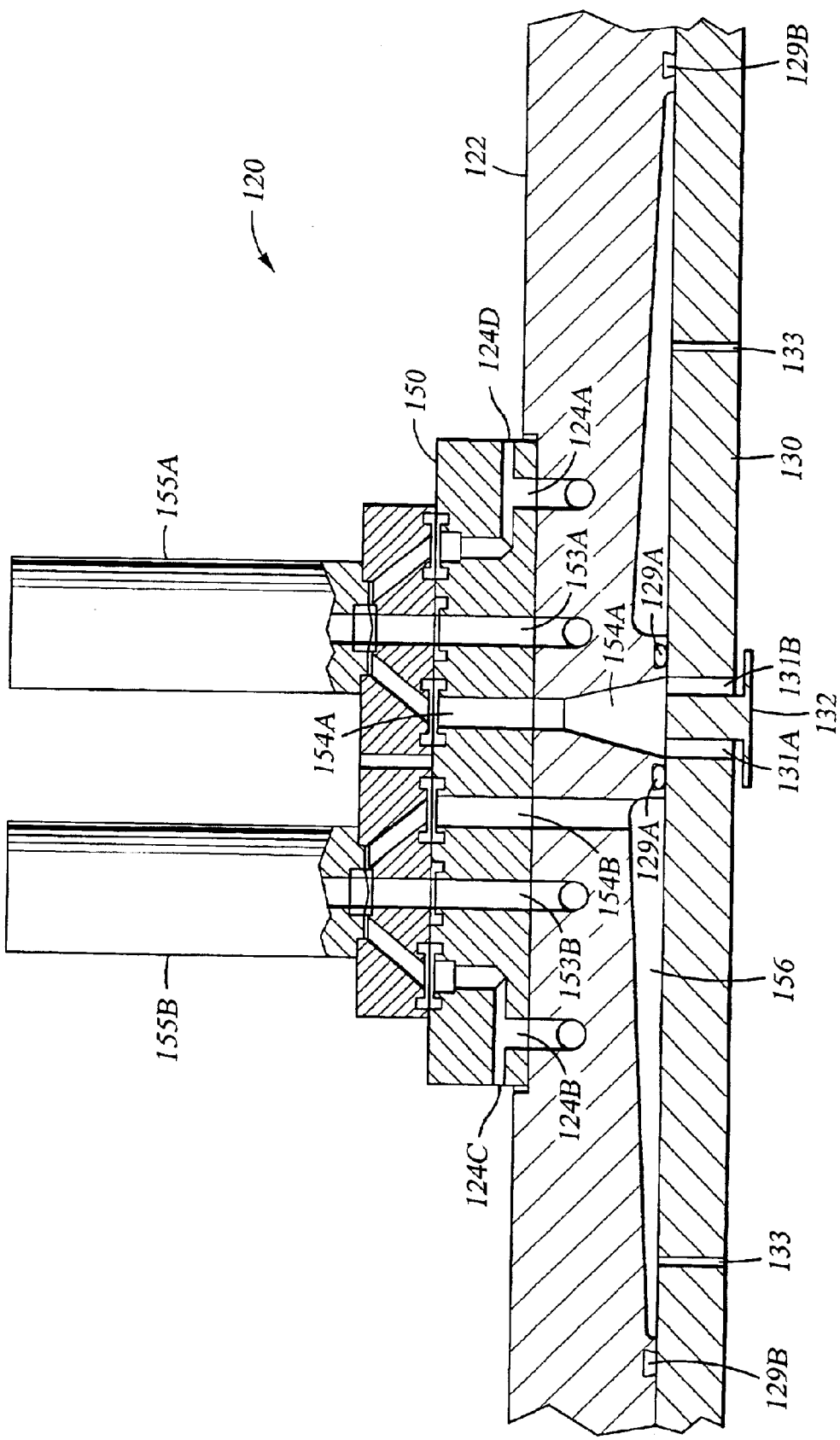
FIG. 3A is a partial cross-sectional view of one embodiment of a lid assembly of the processing system of FIG. 1.
Figure 4:
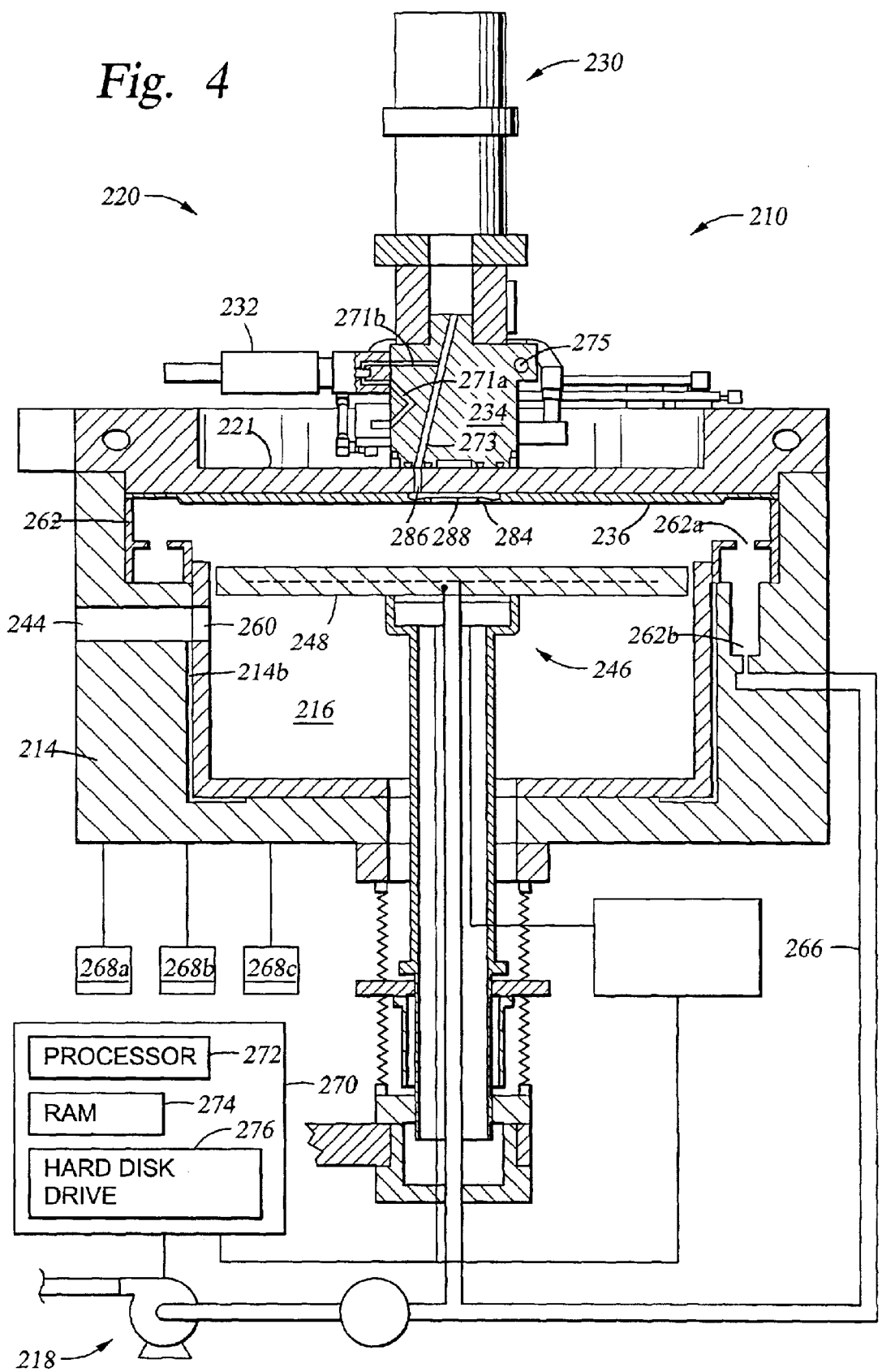
FIG. 4 is a schematic cross-sectional view of another embodiment of a processing system adapted to perform cyclical deposition.

FIGS. 3, 3A, and 4 are drawings of exemplary embodiments of a processing system that may be used to perform cyclical deposition. FIG. 3 is a partial cross-sectional view of one embodiment of a processing system 100 that is shown and described in U.S. patent application Ser. No. 10/032, 293, entitled "Chamber Hardware Design For Titanium Nitride Atomic Layer Deposition," filed on Dec. 21, 2001, which is incorporated by reference herein. The processing system 100 of FIG. 3 comprises a lid assembly 120 disposed on a chamber assembly. The lid assembly includes a lid plate 122, a manifold block 150, one or more valves (one valve 155A is shown in FIG. 3), one or more reservoirs 170, and a distribution plate 130. The lid assembly 120 has one or more isolated zones/flow paths formed therein to deliver one or more process gases to a workpiece/substrate surface disposed in the processing system 100. The term "process gas" is intended to include one or more reactive gas, precursor gas, purge gas, carrier gas, as wells as a mixture or mixtures thereof.

FIG. 3A is a partial cross-sectional view of the lid assembly 120 of the process system 100 of FIG. 3. As shown, the lid assembly includes two valves 155A,B. The valves 155A,B are preferably high speed actuating valves. The valves 155A,B may precisely and repeatedly deliver short pulses of process gases into the chamber body 105. The valves 155A,B can be directly controlled by a system computer, such as a mainframe for example, or controlled by a chamber/application specific controller, such as a programmable logic computer (PLC). The on/off cycles or pulses of the valves 155 may be less than about 100 msec. In one aspect, the valves 155A,B are three-way valves tied to both a precursor gas source and a continuous purge gas source. Each valve 155A,B meters a precursor gas while a purge gas continuously flows through the valve 155A,B.

The valve 155A receives a first process gas from an inlet precursor gas channel 153A and an inlet purge gas channels 124A and delivers the first process gas through an outlet process gas channel 154A formed through the manifold block 150 and the lid plate 122. The outlet gas channel 154A feeds into the chamber body 105 through centrally located openings 131A, 131B formed in the distribution plate 130. An inner diameter of the gas channel 154A gradually increases within the lid plate 122 to decrease the velocity of the first process gas. A dispersion plate 132 is also disposed adjacent the openings 131A, 131B to prevent the first process gas from impinging directly on the workpiece surface by slowing and re-directing the velocity profile of the flowing gases. Without this re-direction, the force asserted on the workpiece by the first process gas may prevent deposition because the kinetic energy of the impinging first process gas can sweep away reactive molecules already disposed on the workpiece surface.

The valve 155B receives a second process gas from an inlet precursor gas channel 153B and an inlet purge gas channels 124B and delivers the second process gas through an outlet process gas channel 154B formed through the manifold block 150 and the lid plate 122. The outlet gas channel 154B feeds into the chamber body 105 via a cavity 156 in the distribution plate 130 and through apertures 133 formed in the distribution plate 130.

The lid assembly further comprises a third valve similar to valves 155A, 155B which receives a third process gases from an inlet precursor gas channel and from an inlet purge channel and delivers the third process gas through an outlet process gas channel formed through the manifold block 150 and the lid plate 122. The outlet gas channel feeds into the chamber body 105 via the cavity 156 in the distribution plate 130 and through the apertures 133 formed in the distribution plate 130. In one aspect, the cavity 156 may include a plurality of channels separating the second process gas and the third process gas.

FIG. 4 is a schematic cross-sectional view of another embodiment of a processing system 210 that is shown and described in U.S. patent application Ser. No. 10/016,300 entitled "Lid Assembly For A Processing System To Facilitate Sequential Deposition Techniques," filed on Dec. 12, 2001, which claims priority to U.S. Provisional Application Serial No. 60/305,970 filed on Jul. 16, 2001, which are both incorporated by reference in its entirety to the extent not inconsistent with the present disclosure. The processing system 210 includes a housing 214 defining a processing chamber 216 and a vacuum lid assembly 220. The vacuum lid assembly 220 includes a lid 221 and a process fluid injection assembly 230 to deliver reactive (i.e. precursor, reductant, oxidant), carrier, purge, cleaning and/or other fluids into the processing chamber 216. The fluid injection assembly 230 includes a gas manifold 234 mounting one or more of control valves 232 (one is shown in FIG. 4), and a baffle plate 236. Programmable logic controllers may be coupled to the control valves 232 to provide sequencing control of the valves. Valves 232 provide rapid gas flows with valve open and close cycles of less than about one second, and in one embodiment, of less than about 0.1 second.

In one aspect, three of the valves 232 are fluidly coupled to three separate reactant gas sources. One of the valves 232 is fluidly coupled to a purge gas source. Each valve 232 is fluidly coupled to a separate trio of gas channels 271a, 271b, 273 (one trio is shown in FIG. 4) of the gas manifold 234. Gas channel 271a provides passage of gases through the gas manifold 234 to the valves 232. Gas channel 271b delivers gases from the valves 232 through the gas manifold 234 and into a gas channel 273. Channel 273 is fluidly coupled to a respective inlet passage 286 disposed through the lid 221. Gases flowing through the inlet passages 286 flow into a plenum or region 288 defined between the lid 221 and the baffle plate 236 before entering the chamber 216. The baffle plate 236 is utilized to prevent gases injected into the chamber 216 from blowing off gases adsorbed onto the surface of the substrate. The baffle plate 236 may include a mixing lip 284 to re-direct gases toward the center of the plenum 288 and into the process chamber 216.

The support pedestal may include an embedded heater element, such as a resistive heater element or heat transfer fluid, utilized to control the temperature thereof. Optionally, a substrate disposed on the support pedestal 248 may be heated using radiant heat. The support pedestal 248 may also be configured to hold a substrate thereon, such as by a vacuum chuck, by an electrostatic chuck, or by a clamp ring.

Disposed along the side walls 214b of the chamber 216 proximate the lid assembly 220 is a pumping channel 262. The pumping channel 262 is coupled by a conduit 266 to a pump system 218 which controls the amount of flow from the processing chamber 216. A plurality of supplies 268a, 268b and 268c of process and/or other fluids, are in fluid communication with one of valves 232 through a sequence of conduits (not shown) formed through the housing 214, lid assembly 220, and gas manifold 234. The processing system 210 may include a controller 270 which regulates the operations of the various components of system 210.

Other processing systems may be used to the methods described herein, such as the processing system disclosed in U.S. patent application Ser. No. 10/032,284 entitled "Gas Delivery Apparatus and Method For Atomic Layer Deposition" filed on Dec. 21, 200, which claims priority to U.S. Provisional Patent Application Serial No. 60/346,086 entitled "Method and Apparatus for Atomic Layer Deposition" filed on Oct. 26, 2001, which are both incorporated by reference in its entirety to the extent not inconsistent with the present disclosure.

One exemplary process of depositing a titanium silicon nitride layer includes the sequential introduction of pulses of titanium tetrachloride ($TiCl_4$) and pulses of ammonia ($NH_3$), and pulses of silane ($SiH_4$). The pulses of reactants may be delivered separately into the chamber or pulses of two or more of the reactants may at least partially overlap. The titanium tetrachloride ($TiCl_4$) may be delivered at a flow rate between about 10 and about 1,000 mgm (milligrams/ minute), preferably at a flow rate of about 100 mgm, in pulses between about 0.05 seconds and about 5 seconds, preferably about 1.0 second or less. Titanium tetrachloride is delivered by utilizing a carrier gas. The carrier gas may be a helium gas (He), an argon gas (Ar), hydrogen gas ($H_2$), nitrogen gas ($N_2$), other suitable gases, and mixtures thereof. Silane may be delivered at a flow rate between about 10 sccm and about 1,000 sccm, preferably at a flow rate of about 100 sccm, in pulses between about 0.05 seconds and about 5 seconds, preferably about 1.0 second or less. A carrier gas, such as a helium gas (He), an argon gas (Ar), hydrogen gas ($H_2$), nitrogen gas ($N_2$), other suitable gases, and mixtures thereof, may be delivered with the silane. Ammonia may be delivered at a flow rate between about 10 sccm and about 1,000 sccm, preferably at a flow rate of about 100 sccm, in pulses between about 0.05 seconds and about 5 seconds, preferably about 1.0 second or less. A carrier gas, such as a helium gas (He), an argon gas (Ar), hydrogen gas ($H_2$), nitrogen gas ($N_2$), other suitable gases, and mixtures thereof, may be delivered with the ammonia.

The substrate temperature may be maintained at a substrate temperature less than 500° C., preferably between about 400° C. and about 450° C., at a chamber pressure between about 0.1 torr and about 20 torr, preferably about 3.0 torr The above process regime provides a deposition rate between about 0.2 Å per cycle to about 3.0 Å per cycle depending on whether deposition proceeds in a self-limiting manner (i.e. a mode of deposition similar to pure atomic layer deposition) or in a partially self-limiting manner (i.e. a mode of deposition similar to a combination of atomic layer deposition and chemical vapor deposition).

Formation of Variable Content Titanium Silicon Nitride Layer

A titanium silicon nitride layer comprising varying amounts of titanium, silicon, and nitrogen through the depth of the ternary material layer may be formed by cyclical deposition. In one aspect, cyclical deposition allows for a more precise control of incorporation of amounts of titanium, silicon, and nitrogen into the layer by the introduction of compounds in pulses. For example, the flow ratio of pulses of the precursors may be provided at a first ratio during initial cycles to form a first sub-layer having a first composition and the pulses of the precursor may be provided at a second ratio during final cycles to form a sub-layer having a second composition. In another embodiment, the pulses may be provided at a first sequence during initial cycles to form a first sub-layer having a first composition and the pulses may be provided at a second sequence during later cycles to form a second sub-layer.

Figure 5:
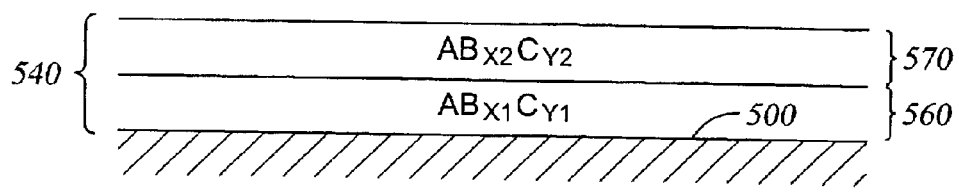
FIG. 5 is a schematic cross-sectional view of one example of tuning the composition of a ternary material layer.

FIG. 5 is a schematic cross-sectional view of one example of tuning the composition of a ternary material layer 540 utilizing a single process chamber. For example, initial cycles may comprise pulsing in the second precursor and the third precursor in which the pulses comprise a ratio of the second precursor to the third precursor to deposit a bottom sub-layer 560 with the composition of $AB_{X1}C_{Y1}$ over a substrate structure 500. Then, final cycles may comprise pulsing in the second precursor and the third precursor in which the ratio of the second precursor to the third precursor is increased to deposit a top sub-layer 570 with the composition of $AB_{X2}C_{Y2}$ in which X2>X1. Thus, a ternary material layer 540 comprising a bottom layer ($AB_{X1}C_{Y1}$) 560 and a top sub-layer ($AB_{X2}C_{Y2}$) 570 in which X2>X1 is formed.

The ternary material layer 540 may be tuned to more than two different sub-layers and may be tuned to any ratio of element A to element B to element C for each of these sub-layers as desired for a particular application. For example, the second precursor and the third precursor may be introduced into the chamber at a flow ratio of the second precursor and the third precursor of about 0 to about 1 to provide a sub-layer having the composition $AC_Y$. Therefore, the ternary material layer may comprise a sub-layer of two elements. However, the ternary material layer 540 as a whole comprises three elements. In addition, the ternary material layer 540 may be gradually tuned to provide a graded layer comprising a plurality of sub-layers providing a gradually altering composition. Not wishing to be bound by theory, it is believed that a graded layer may provide a film having improved stress characteristics. In addition, it is believed that a graded layer may provide improved adhesion of the sub-layers with one another.

Figure 6:
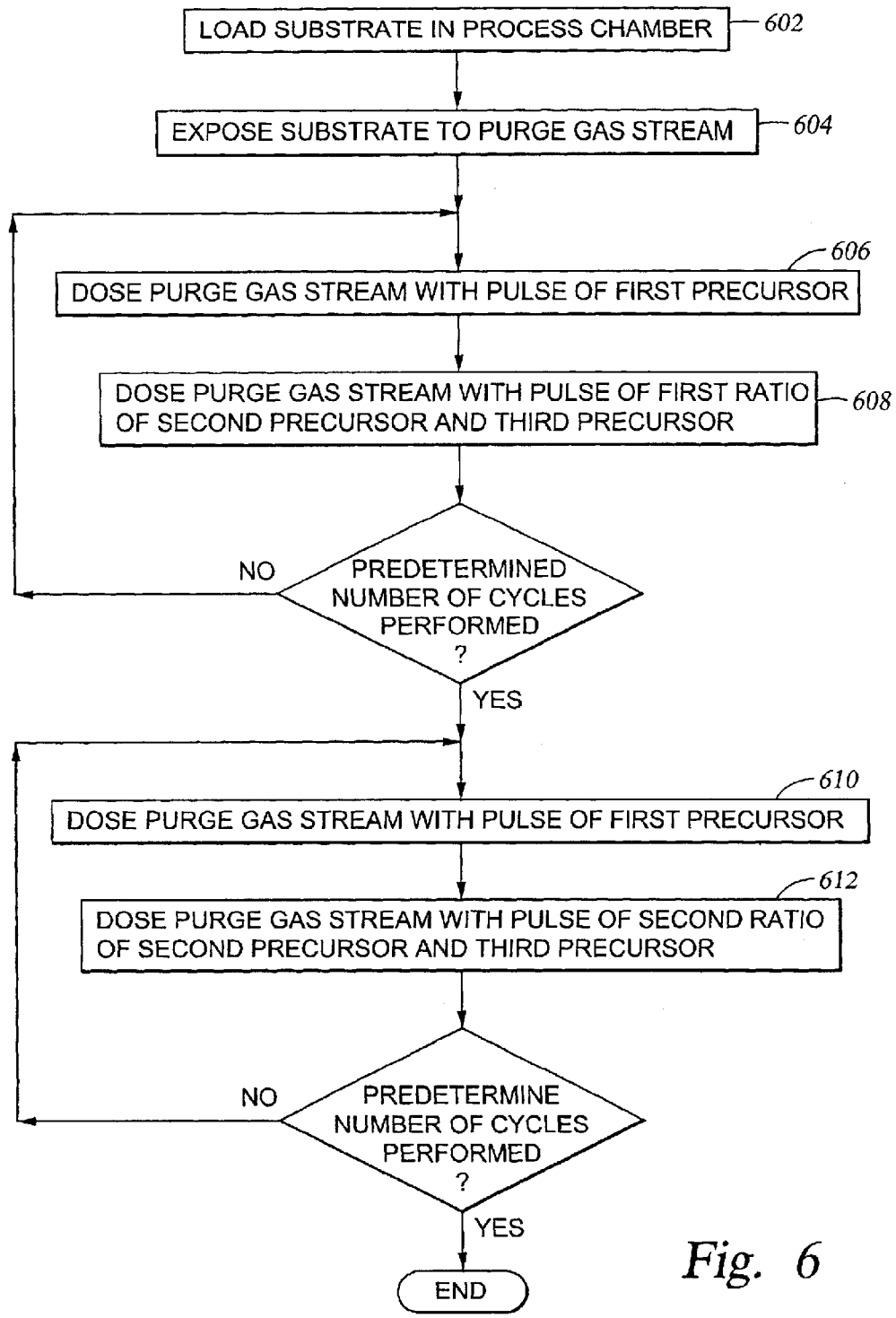
FIG. 6 is a flow chart illustrating one embodiment of a process utilizing a continuous flow of a purge gas to deposit a ternary material layer with a tuned composition.

FIG. 6 is a flow chart illustrating one embodiment of a process utilizing a continuous flow of a purge gas to deposit a ternary material layer with a tuned composition. These steps may be performed in a chamber, such as chamber 100 described in reference to FIGS. 3 and 3A and chamber 210 described in reference to FIG. 4. As shown in step 602, a substrate is provided to the process chamber. The process chamber conditions, such as for example the substrate temperature and pressure, may be adjusted. In step 604, a purge gas stream is established within the process chamber. Referring to step 606, after the purge gas stream is established within the process chamber, a pulse of a first precursor is added or dosed into the purge gas stream. In step 608, after the pulse of the first precursor, a pulse of a second precursor and a third precursor is dosed into the purge gas stream at a first ratio of the second precursor to the third precursor. Step 606 and step 608 are repeated until a predetermined number of cycles are performed to form a first sub-layer. Referring to step 610, after a predetermined number of cycles of step 606 and step 608 are performed, a pulse of the first precursor is dosed into the purge gas stream. In step 612, after the pulse of the first precursor, a pulse of the second precursor and the third precursor is dosed into the purge gas stream at a second ratio of the second precursor to the third precursor. Step 610 and step 612 are repeated until a predetermined number of cycles are performed to form a second sub-layer. Other embodiments include depositing a ternary material layer with a tuned composition comprising more than two sub-layers. Other embodiments of a process utilizing a continuous flow of a purge gas are possible to deposit a ternary material layer with a tuned composition. For example, the second precursor and the third precursor may be introduced in partially overlapping pulses.

Figure 7:
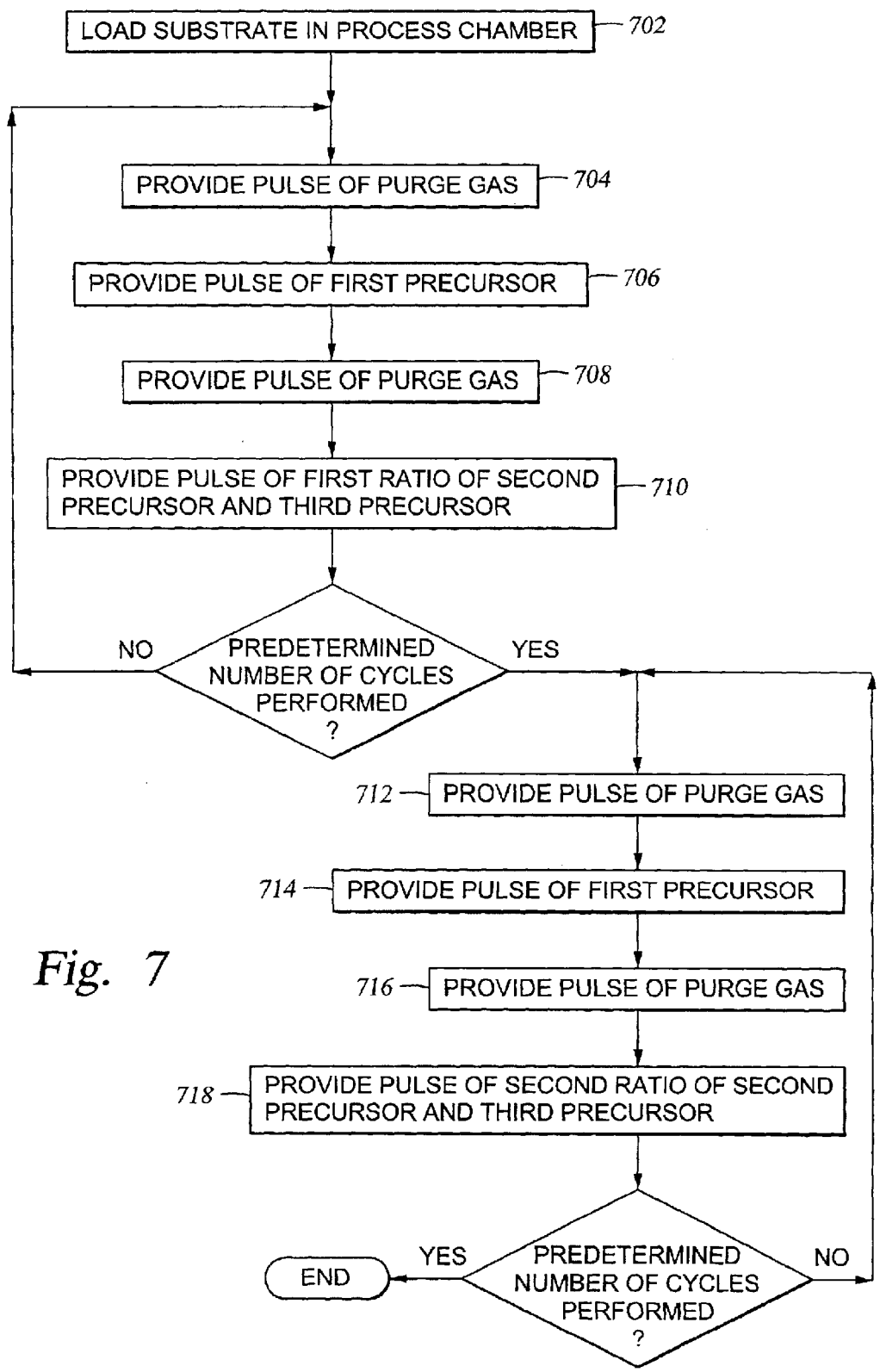
FIG. 7 is a flow chart illustrating one embodiment of a process utilizing pulses of a purge gas to deposit a ternary material layer with a tuned composition.

FIG. 7 is a flow chart illustrating one embodiment of a process utilizing pulses of a purge gas to deposit a ternary material layer with a tuned composition. These steps may be performed in a chamber, such as chamber 100 described in reference to FIGS. 3 and 3A and chamber 210 described in reference to FIG. 4. As shown in step 702, a substrate is provided to the process chamber. The process chamber conditions, such as for example the substrate temperature and pressure, may be adjusted. In step 704, a pulse of a purge gas is provided to the process chamber. Referring to step 706, after the pulse of the purge gas of step 704 is introduced, a pulse of a first precursor is provided to the process chamber. In step 708, after the pulse of the first precursor is provided, another pulse of the purge gas is provided to the process chamber. In step 710, after the pulse of the purge gas of step 708 is introduced, a pulse of a second precursor and a third precursor is provided to the process chamber at a first ratio of the second precursor to the third precursor. Steps 704, 706, 708, 710 are repeated until a predetermined number of cycles are performed to form a first sub-layer. Referring to step 712, after a predetermined number of cycles of steps 704, 706, 708, 710 are performed, another pulse of the purge gas is provided to the process chamber. Referring to step 714, after the pulse of the purge gas of step 712 is introduced, a pulse of the first precursor is provided to the process chamber. In step 716, after the pulse of the first precursor is provided, another pulse of the purge gas is provided to the process chamber. In step 718, after the pulse of the purge gas of step 716 is introduced, a pulse of the second precursor and the third precursor is provided to the process chamber at a second ratio of the second precursor to the third precursor. Steps 712, 714, 716, and 718 are repeated until a predetermined number of cycles are performed to form a second sub-layer. Other embodiments include depositing a ternary material layer with a tuned composition comprising more than two sub-layers. Also, other embodiments of a process utilizing pulses of a purge gas are possible to deposit a ternary material layer with a tuned composition. For example, the second precursor and the third precursor may be introduced in partially overlapping pulses.

Figure 8A:
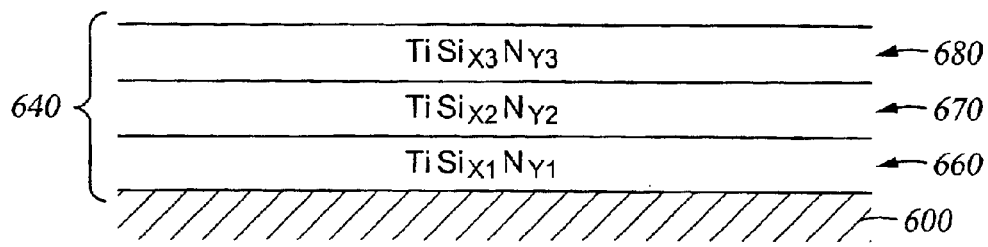
FIGS. 8A–C are schematic cross-sectional views of embodiments of a variable content titanium silicon nitride layer formed by cyclical deposition.

FIG. 8A is a schematic cross-sectional view of one specific embodiment of a variable content titanium silicon nitride layer 640 formed by cyclical deposition over a substrate structure 600. The variable content titanium silicon nitride layer 640 includes a bottom sub-layer 660 comprising $TiSi_{X1}N_{Y1}$, a middle sub-layer 670 comprising $TiSi_{X2}N_{Y2}$ in which X1<X2, and a top sub-layer 680 comprising $TiSi_{X3}N_{Y3}$ in which X3<X2. In one specific embodiment, the bottom sub-layer 660 is deposited to a thickness between about 0.2 Å and about 50 Å, preferably between about 1.0 Å and about 20 Å, the middle sub-layer 670 is deposited to a thickness between about 0.2 Å and about 100 Å, preferably between about 5 Å and about 50 Å, and the top sub-layer 680 is deposited to a thickness between about 0.2 Å and about 50 Å, preferably between about 1.0 Å and about 20 Å. The variable content titanium silicon nitride layer 640 may also comprise additional sublayers. For example, the variable content titanium silicon nitride may comprise one or more sublayers of any composition of TiSi$_{x\#}$N$_{Y\#}$ between the bottom sub-layer 660 and the middle sub-layer 670 and/or between the middle sub-layer 670 and the top sub-layer 680.

Figure 8B:
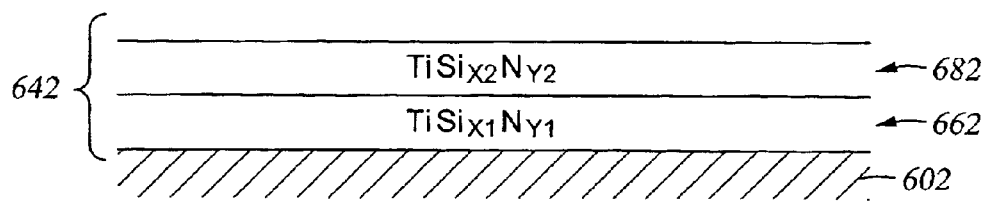

FIG. 8B is a schematic cross-sectional view of another specific embodiment of a variable content titanium silicon nitride layer 642 formed by cyclical deposition. The variable content titanium silicon nitride layer 642 includes a bottom sub-layer 662 comprising TiSi$_{X1}$N$_{Y1}$ and a top sub-layer 682 comprising TiSi$_{X2}$N$_{Y2}$ in which X2>X1. In one specific embodiment, the bottom sub-layer 662 is deposited to a thickness between about 0.2 Å and about 100 Å, preferably between about 5 Å and about 50 Å, and the top sub-layer 682 is deposited to a thickness between about 0.2 Å and about 50 Å, preferably between about 1.0 Å and about 20 Å. The variable content silicon nitride layer 642 may also comprise additional sublayers. For example, the variable content titanium silicon nitride may comprise one or more sublayers of any composition of TiSi$_{x\#}$N$_{Y\#}$ between the bottom sub-layer 662 and the top sub-layer 682.

Figure 8C:
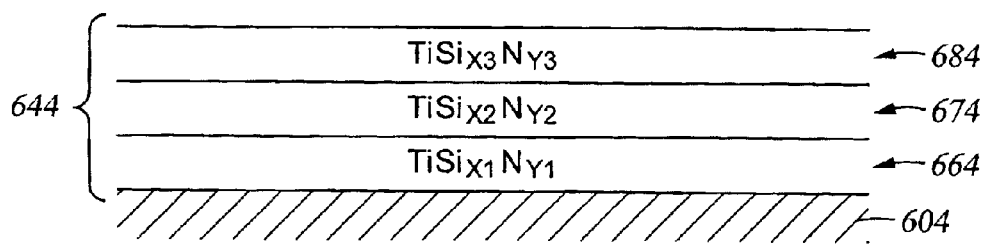

FIG. 8C is a schematic cross-sectional view of still another specific embodiment of a variable content titanium silicon nitride layer 644 formed by cyclical deposition. The variable content titanium silicon nitride layer 644 includes a bottom sub-layer 664 comprising TiSi$_{X1}$N$_{Y1}$, a middle sub-layer 674 comprising TiSi$_{X2}$N$_{Y2}$ in which X1 >X2, and a top sub-layer 684 comprising TiSi$_{X3}$N$_{Y3}$ in which X3>X2. In one specific embodiment, the bottom sub-layer 664 is deposited to a thickness between about 0.2 Å and about 50 Å, preferably between about 1.0 Å and about 20 Å, the middle sub-layer 674 is deposited to a thickness between about 0.2 Å and about 100 Å, preferably between about 5 Å and about 50 Å, and the top sub-layer 684 is deposited to a thickness between about 0.2 Å and about 50 Å, preferably between about 1.0 Å and about 20 Å. The variable content titanium silicon nitride layer 644 may also comprise additional sublayers. For example, the variable content titanium silicon nitride may comprise one or more sublayers of any composition of TiSi$_{x\#}$N$_{Y\#}$ between the bottom sub-layer 664 and the middle sub-layer 674 and/or between the middle sub-layer 674 and the top sub-layer 684.

Applications

Figure 9:
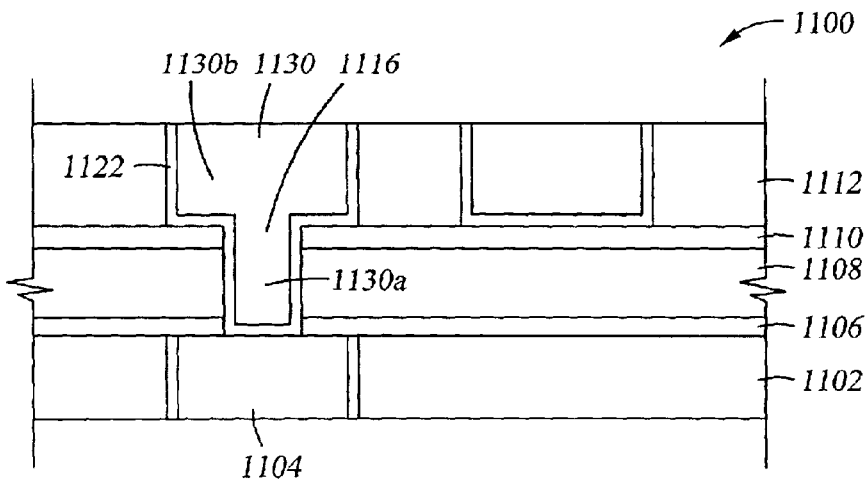
FIG. 9 is a schematic cross-sectional view of one embodiment of a specific application of a variable content titanium silicon nitride layer at one stage in the formation of an integrated circuit.

FIG. 9 is a schematic cross-sectional view of one embodiment of a specific application of a variable content titanium silicon nitride layer 640 (FIG. 8A) utilized as a barrier layer in a dual damascene structure 1100 at one stage in the formation of an integrated circuit. The structure 1100 includes an underlying substrate 1102, such as a semiconductor substrate or a glass substrate as well as other materials formed on the substrate such as a dielectric layer or other layers. The underlying substrate 1102 may be patterned to provide an aperture for formation of a copper feature 1104. A barrier layer 1106 may be formed over the substrate 1102 followed by formation of a dielectric layer 1108 thereover, such as a silicon oxide layer, a FSG layer, or a low-k dielectric layer. One example of a low-k dielectric layer is an oxidized organosilane layer or an oxidized organosiloxane layer described in more detail in U.S. Pat. No. 6,348,725, issued Feb. 19, 2002, which is incorporated by reference herein. An etch stop layer 1110, such as a silicon oxide layer, a silicon nitride layer, or a silicon carbide layer, is deposited over the dielectric layer 1108. The etch stop is patterned to define the openings of a contact/via. Another dielectric layer 1112, such as a low-k dielectric layer, is formed over the patterned etch stop layer 1110. A photoresist layer is formed and patterned over the dielectric layer 1112. Then, an etch process is performed to define the interconnects down to the etch stop layer 1110 and down to the copper feature 1104 to form an aperture 1116. The photoresist is removed using methods well-known in the art. Then, a contact barrier layer 1122 comprising a variable content titanium silicon nitride layer 640 (FIG. 8A) may be formed over the aperture 1116. A copper conductive layer 1130 may be deposited over the contact barrier layer 1122 to form a via/contact 1130a and a line/trench 1130b. The copper conductive layer 1130 may comprise one or more deposited layers. For example, the copper conductive layer 1130 may comprise a copper seed layer and a bulk copper layer deposited thereover. Typically, the bulk copper layer is deposited by electroplating. An exemplary electroplating method is described in U.S. Pat. No. 6,113,771, entitled "Electro Deposition Chemistry", issued Sep. 5, 2000, and is incorporated herein by reference. Once the structure has been filled with copper, the surface is planarized using chemical mechanical polishing.

A contact barrier layer 1122 comprising a variable content titanium silicon nitride layer 640 (FIG. 8A) is well-suited for the use in the formation of advanced integrated circuits utilizing copper metallization. The contact barrier layer 1122 comprising a variable content titanium silicon nitride layer 640 (FIG. 8A) has good adhesion with low-k dielectric materials. In addition, the variable content titanium silicon nitride layer 640 (FIG. 8A) has good adhesion with a copper layer, such as a copper seed layer and a bulk copper layer over the copper seed layer. Furthermore, the variable content titanium silicon nitride layer 640 (FIG. 8A) is compatible with the deposition processes utilized to form a copper layer thereover, such as an electroplating process utilized to form a bulk copper layer.

In reference to FIG. 9, it is believed that there is less formation of copper silicide at the interface of the contact barrier layer 1122 comprising a variable content titanium silicon nitride layer 640 (FIG. 8A) with the copper feature 1104 and with the copper conductive layer 1130 in comparison to prior titanium silicon nitride layers. Since copper silicide has a high resistance, the variable content titanium silicon nitride layer 640 utilized as a contact barrier layer 1122 between two copper interconnects will have a reduced resistance in comparison to the use of prior titanium silicon nitride layers. Not wishing to be bound by theory, it is believed that since the bottom sub-layer TiSi$_{X1}$N$_{Y1}$ and the top sub-layer TiSi$_{X3}$N$_{Y3}$ comprise a reduced amount of silicon, there is less formation of copper silicide at the interface of the bottom sub-layer TiSi$_{X1}$N$_{Y1}$ and the top sub-layer TiSi$_{X3}$N$_{Y3}$ with a surface comprising copper in comparison to prior titanium silicon nitride layers. In one embodiment, a pulse of a titanium precursor and/or a pulse of nitrogen precursor are provided in a cyclical deposition sequence prior to a pulse of a silicon precursor to form a bottom sub-layer with a reduced amount of silicon. The variable content titanium silicon nitride layer 640 may also be used as a barrier layer with other surfaces comprising copper, in other substrate structures, and in other applications.

Figure 10A:
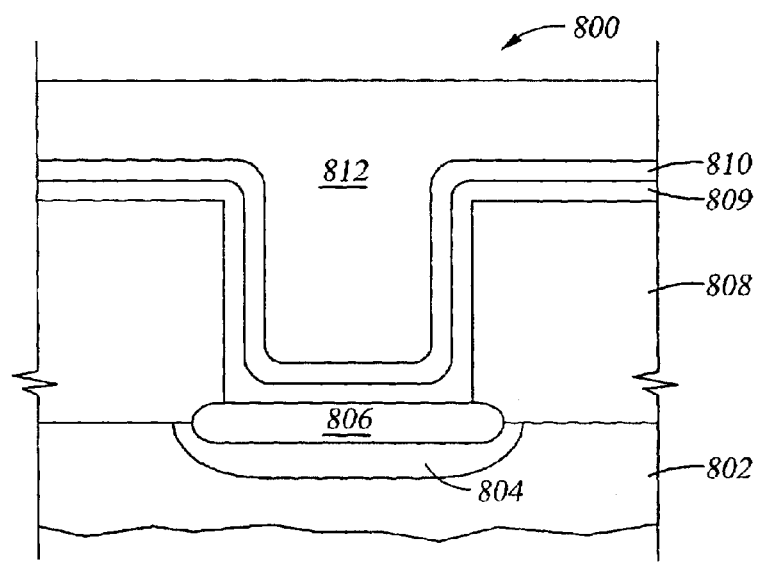
FIG. 10A is a schematic cross-sectional view of another embodiment of a specific application of a variable content titanium silicon nitride layer at one stage in the formation of an integrated circuit.

FIG. 10A is a schematic cross-sectional view of one embodiment of a specific application of a variable content titanium silicon nitride layer 642 of FIG. 8B or a variable content titanium silicon nitride layer 644 of FIG. 8C utilized as an adhesion/barrier layer over a metal silicide contact in the film stack 800 at one stage in the formation of an integrated circuit. As shown in FIG. 10A, the film stack 800 includes an underlying substrate 802, such as a semiconductor substrate, and includes a doped source/drain region 804. A metal silicide layer 806, such as a titanium silicide layer, nickel silicide layer, or cobalt silicide, layer may be formed over the region 804. A dielectric layer 808, such as a silicon dioxide layer, may be formed over the metal silicide layer 806. The dielectric layer 808 may be patterned and etched to form an aperture exposing the metal silicide layer 806. A titanium layer 809 may be deposited over the aperture to help remove native oxides which may have formed on exposed surfaces. An adhesion/barrier layer 810 comprising a variable content titanium silicon nitride layer 642 (FIG. 8B) or comprising a variable content titanium silicon nitride layer 644 (FIG. 8C) may be formed over the titanium layer 809. A conductive layer 812, such as a tungsten layer, may be deposited over the adhesion/barrier layer 810. In other embodiments, the metal silicide layer may be formed over a transistor gate.

Figure 10B:
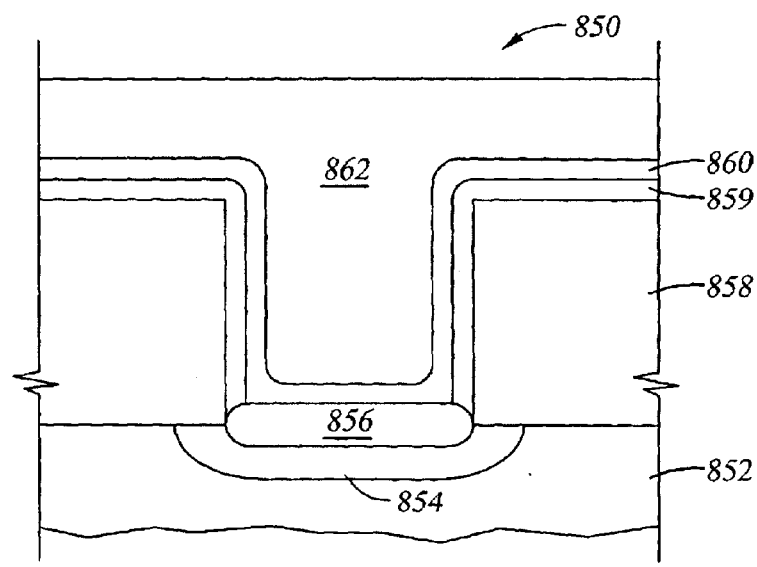
FIG. 10B is a schematic cross-sectional view of still another embodiment of a specific application of a variable content titanium silicon nitride layer at one stage in the formation of an integrated circuit.

FIG. 10B is a schematic cross-sectional view of another embodiment of a specific application of a variable content titanium silicon nitride layer 642 of FIG. 8B or a variable content titanium silicon nitride layer 644 of FIG. 8C utilized as an adhesion/barrier layer over a metal silicide contact in the film stack 850 at one stage in the formation of an integrated circuit. As shown in FIG. 10B, the film stack 850 includes an underlying substrate 852, such as a semiconductor substrate, and includes a doped source/drain region 854. A dielectric layer 858, such as a silicon dioxide layer, may be formed over the substrate 852. The dielectric layer 858 may be patterned and etched to form an aperture. A titanium layer 859 may be deposited over the aperture to form titanium silicide 856 in situ. An adhesion/barrier layer 860 comprising a variable content titanium silicon nitride layer 642 (FIG. 8B) or comprising a variable content titanium silicon nitride layer 644 (FIG. 8C) may be formed over the titanium layer 859. A conductive layer 862, such as a tungsten layer, may be deposited over the adhesion/barrier layer 860. In other embodiments, the titanium silicide may be formed over a transistor gate.

In regards to the applications shown in FIGS. 10A–B, the variable content titanium silicon nitride layer 642 (FIG. 8B) comprises a top sub-layer 682 with a larger amount of silicon in comparison to the bottom sub-layer 662. Not wishing to be bound by theory, it is believed that top sub-layer 682 (FIG. 8B) with a larger amount of silicon improves the adhesion of a tungsten layer, such as a tungsten conductive layer 812 (FIG. 10A) or 862 (FIG. 10B), deposited thereover. In one theory, it is believed that the top sub-layer 682 provides improved barrier properties to halogen diffusion, such as fluorine diffusion during the deposition of tungsten utilizing tungsten hexafluoride. Therefore, tungsten has improved adhesion over the top sub-layer 682 since there are less halogens at the interface of the tungsten layer and the top sub-layer. The variable content titanium silicon nitride layer 642 may also be used as an adhesion/barrier layer in other substrate structures and may also be used in other applications.

In regards to the applications shown in FIGS. 10A–B, the variable content titanium silicon nitride layer 644 (FIG. 8C) also provides improved adhesion of a conductive tungsten layer 812 (FIG. 10A) or 862 (FIG. 10B) deposited thereover since the variable content titanium silicon nitride layer 644 also comprises a larger amount of silicon in the top sub-layer 684. The variable content titanium silicon nitride layer 644 (FIG. 8C) comprises a bottom sub-layer 664 with a larger amount of silicon in comparison to the middle sub-layer 674. Not wishing to be bound by theory, it is believed that the bottom sub-layer 684 has improved adhesion over the titanium layer 809 (FIG. 10A) or 859 (FIG. 10B). In one theory, it is believed that the bottom sub-layer 664 comprising a larger amount of silicon reduces the etching effect of the titanium layer 809 or 859 caused by a titanium precursor, such as a titanium halide, used during the deposition of the titanium silicon nitride layer 644. Therefore, the bottom sub-layer 664 improves the interface therebetween with the titanium layer 809 or 859. In one embodiment, a pulse of a silicon precursor is provided in a cyclical deposition sequence prior to a pulse of a titanium precursor and/or a pulse of a nitrogen precursor to form a bottom sub-layer with an increased amount of silicon. The variable content titanium silicon nitride layer 644 may also be used as an adhesion/barrier layer in other substrate structures and may also be used in other applications.

Other embodiments and applications of a variable content titanium silicon nitride layer are possible. For example, other applications of a variable content titanium silicon nitride layer include, but are not limited to, use as a capacitor electrode or use as a metal gate.

Figure 11:
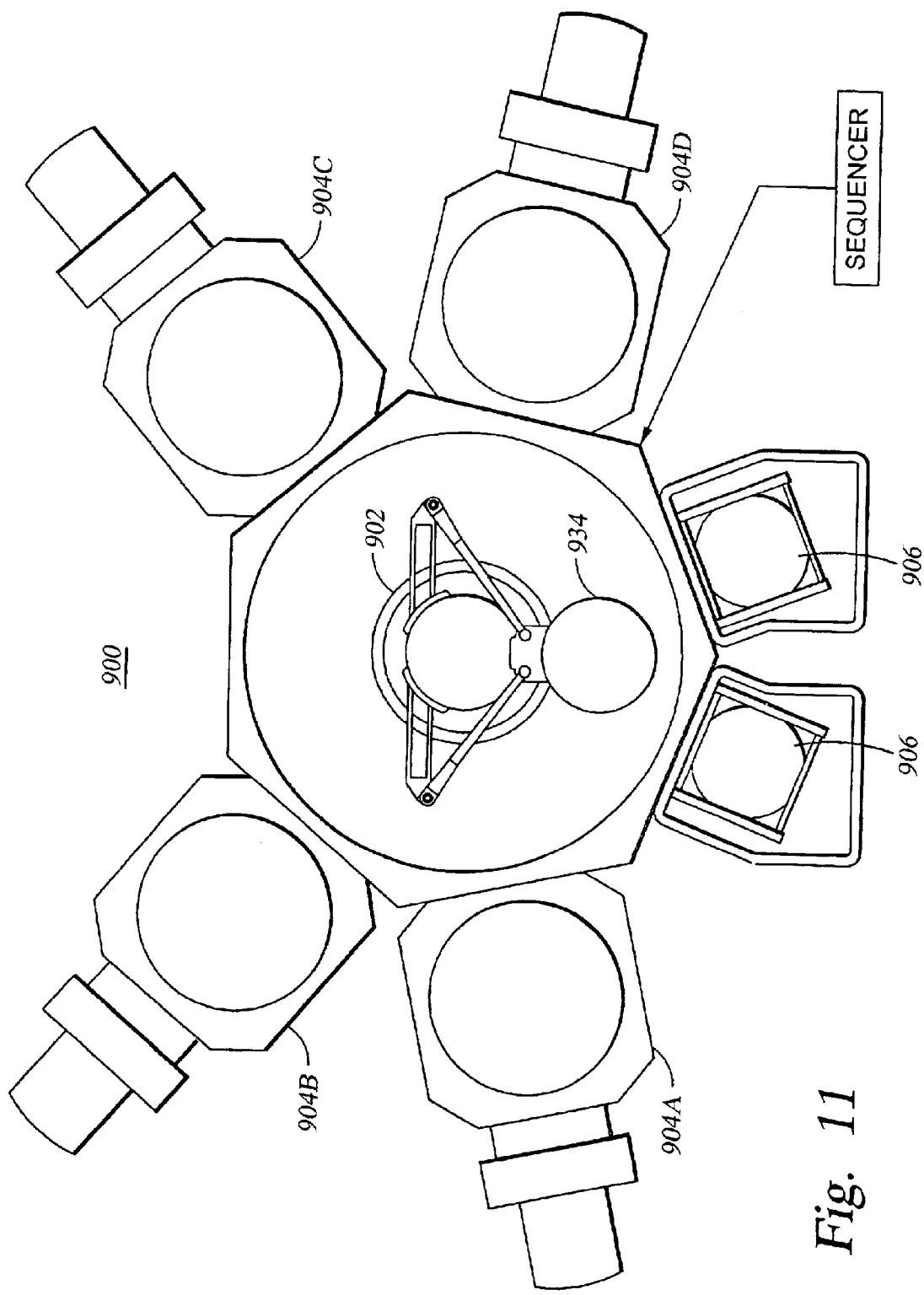
FIG. 11 is a schematic top view of one example of a multi-chamber processing system which may be adapted to perform processes as disclosed herein in the formation of a film stack.

The processes in the formation of a film stack as disclosed herein may be carried out in separate chambers or may be carried out in a multi-chamber processing system having a plurality of chambers. FIG. 11 is a schematic top view of a multi-chamber processing system 900 capable of performing the processes disclosed herein. The apparatus is a Centura® system and is commercially available from Applied Materials, Inc., located in Santa Clara, Calif. The particular embodiment of the system 900 is provided to illustrate the invention and should not be used to limit the scope of the invention.

The system 900 generally includes load lock chambers 906 for the transfer of substrates into and out from the system 900. Typically, since the system 900 is under vacuum, the load lock chambers 906 may "pump down" the substrates introduced into the system 900. A robot 902 having a blade 934 may transfer the substrates between the load lock chambers 906 and processing chambers 904A, 904B, 904C, 904D. Any of the processing chambers 904A, 904B, 904C, 904D may be removed from the system 900 if not necessary for the particular process to be performed by the system 900.

In one embodiment, the system 900 is configured to deposit a titanium silicon nitride layer, such as titanium silicon nitride layer 540, 640, 642, 644 as described in relation to FIG. 5 and FIG. 8, by cyclical layer deposition. For example, in regards to the application shown in FIG. 9, one embodiment of system 900 may comprise process chamber 904A adapted to deposit a titanium silicon nitride layer 640 (FIG. 8A) and may comprise process chamber 904B adapted to deposit a copper conductive layer 1130 (FIG. 9) over the titanium silicon nitride layer 640. Another embodiment of system 900 may comprise process chamber 904A adapted to deposit a titanium silicon nitride layer 640 (FIG. 8A), process chamber 904B adapted to deposit a copper seed layer over the titanium silicon nitride layer 640, and process chamber 904C adapted to deposit a bulk copper layer over the copper seed layer.

For example in regards to the applications shown in FIGS. 10A–B, one embodiment of system 900 may comprise process chamber 904A adapted to deposit a titanium layer 809 or 859 (FIGS. 10A–B) and process chamber 904B adapted to deposit a titanium silicon nitride layer 642 or 644

(FIGS. 8B–C) over the titanium layer 809 or 859. One embodiment of system 900 may comprise process chamber 904A adapted to deposit a titanium silicon nitride layer 642 or 644 (FIGS. 8B–C) and process chamber 904B adapted to deposit a tungsten layer 812 or 862 (FIGS. 10A–B) over the titanium silicon nitride layer 642 or 644. One embodiment of system 900 may comprise process chamber 904A adapted to deposit a titanium layer 809 or 859 (FIGS. 10A–B), process chamber 904B adapted to deposit a titanium silicon nitride layer 642 or 644 (FIGS. 8B–C) over the titanium layer 809, and process chamber 904C adapted to deposit a tungsten layer 812 or 862 (FIGS. 10A–B) over the titanium silicon nitride layer 642 or 644.

Other configurations of system 900 are possible. For example, the position of a particular processing chamber on the system 900 may be altered. Other embodiments of the system are within the scope of the present invention. For example, an Endura® multi-chamber processing system, commercially available from Applied Materials, Inc., located in Santa Clara, Calif., may be used.

While foregoing is directed to the preferred embodiment of the present invention, other and further embodiments of the invention may be devised without departing from the basic scope thereof, and the scope thereof is determined by the claims that follow.

What is claimed is:

1. A method of forming a variable content titanium silicon nitride layer, comprising:
   (a) providing pulses of a titanium precursor;
   (b) providing pulses of a silicon precursor and providing pulses of a nitrogen precursor at a ratio of the silicon precursor to the nitrogen precursor; and
   (c) decreasing the ratio of the silicon precursor to the nitrogen precursor.

2. The method of claim 1, wherein providing pulses of a titanium precursor comprises dosing pulses of the titanium precursor into a purge gas stream and wherein providing pulses of a silicon precursor and providing pulses of a nitrogen precursor comprises dosing pulses of the silicon precursor and dosing pulses of the nitrogen precursor into a purge gas stream.

3. The method of claim 1, further comprising providing pulses of a purge gas between the pulses of the titanium precursor and pulses of the silicon precursor and the nitrogen precursor.

4. The method of claim 1, wherein the pulses of the silicon precursor and the nitrogen precursor at least partially overlap.

5. The method of claim 1, wherein the pulses of the silicon precursor and the nitrogen precursor are delivered separately.

6. The method of claim 1, wherein the variable content titanium silicon nitride layer is formed over a titanium layer.

7. The method of claim 6, wherein at least a portion of the titanium layer is converted to titanium suicide.

8. The method of claim 6, wherein the titanium layer is deposited over a metal silicide layer.

9. A method of processing a substrate, comprising:
   forming a variable content titanium silicon nitride layer, comprising:
      delivering a silicon precursor, a titanium precursor, and a nitrogen precursor to the substrate at a first ratio of silicon precursor to nitrogen precursor, and
      delivering the silicon precursor, the titanium precursor, and the nitrogen precursor to the substrate at a second ratio of silicon precursor to nitrogen precursor, and
      delivering the silicon precursor, the titanium precursor, and the nitrogen precursor to the substrate at a third ratio of silicon precursor to nitrogen precursor; and
   forming a copper material layer over the variable content titanium silicon nitride layer.

10. The method of claim 9, wherein the first ratio is less than the second ratio and wherein the third ratio is less than the second ratio.

11. The method of claim 10, wherein the variable content titanium silicon nitride layer is formed over a dielectric layer.

12. The method of claim 11, wherein the dielectric layer comprises a low-k dielectric layer.

13. The method of claim 12, wherein the dielectric layer comprises a low-k material selected from the group including oxidized organosilane film and oxidized organosiloxane film.

14. A method of forming a variable content titanium silicon nitride layer, comprising:
   (a) providing pulses of a titanium precursor;
   (b) providing pulses of a silicon precursor and providing pulses of a nitrogen precursor at a ratio of the silicon precursor to the nitrogen precursor;
   (c) increasing the ratio of the silicon precursor to the nitrogen precursor; and
   (d) decreasing the ratio of the silicon precursor to the nitrogen precursor.

15. The method of claim 14, wherein the variable content titanium silicon nitride layer is formed over a dielectric layer and a conductive material layer comprising copper.

16. The method of claim 14, wherein providing pulses of a titanium precursor comprises dosing pulses of the titanium precursor into a purge gas stream and wherein providing pulses of a silicon precursor and providing pulses of a nitrogen precursor comprises dosing pulses of the silicon precursor and dosing pulses of the nitrogen precursor into a purge gas stream.

17. The method of claim 14, further comprising providing pulses of a purge gas between the pulses of the titanium precursor and pulses of the silicon precursor and the nitrogen precursor.

18. The method of claim 14, wherein the pulses of the silicon precursor and the nitrogen precursor at least partially overlap.

19. The method of claim 14, wherein the pulses of the silicon precursor and the nitrogen precursor are delivered separately.

20. The method of claim 14, wherein the variable content titanium silicon nitride layer is formed over a conductive material layer comprising copper.

21. The method of claim 14, wherein the variable content titanium silicon nitride layer is formed over a dielectric layer.

22. The method of claim 21, wherein the dielectric layer comprises a low-k dielectric layer.

23. The method of claim 22, wherein the dielectric layer comprises a low-k material selected from the group including oxidized organosilane film and oxidized organosiloxane film.

24. A method of forming a variable content titanium silicon nitride layer, comprising:
   (a) providing pulses of a titanium precursor;
   (b) providing pulses of a silicon precursor and providing pulses of a nitrogen precursor at a ratio of the silicon precursor to the nitrogen precursor;
   (c) decreasing the ratio of the silicon precursor to the nitrogen precursor; and (d) increasing the ratio of the silicon precursor to the nitrogen precursor.

25. The method of claim 24, wherein providing pulses of a titanium precursor comprises dosing pulses of the titanium precursor into a purge gas stream and wherein providing pulses of a silicon precursor and providing pulses of a nitrogen precursor comprises dosing pulses of the silicon precursor and dosing pulses of the nitrogen precursor into a purge gas stream.

26. The method of claim 24, further comprising providing pulses of a purge gas between the pulses of the titanium precursor and pulses of the silicon precursor and the nitrogen precursor.

27. The method of claim 24, wherein the pulses of the silicon precursor and the nitrogen precursor at least partially overlap.

28. The method of claim 24, wherein the pulses of the silicon precursor and the nitrogen precursor are delivered separately.

29. The method of claim 24, wherein the variable content titanium silicon nitride layer is formed over a titanium layer.

30. The method of claim 29, wherein a portion of the titanium layer is converted to a titanium suicide.

31. The method of claim 29, wherein the titanium layer is deposited over a metal silicide layer.

32. A method of processing a substrate, comprising:

forming a variable content titanium silicon nitride layer, comprising:

delivering a silicon precursor, a titanium precursor, and a nitrogen precursor to the substrate at a first ratio of silicon precursor to nitrogen precursor, and delivering the silicon precursor, the titanium precursor, and the nitrogen precursor to the substrate at a second ratio of silicon precursor to nitrogen precursor; and forming a copper material layer over the variable content titanium silicon nitride layer.

33. The method of claim 32, wherein the variable content titanium silicon nitride layer is formed over a dielectric layer.

34. The method of claim 33, wherein the dielectric layer comprises a low-k dielectric layer.

35. The method of claim 34, wherein the dielectric layer comprises a low-k material selected from the group including oxidized organosilane film and oxidized organosiloxane film.

* * * * *